United States Patent [19]

Hayasaka et al.

[11] Patent Number: 5,298,112

[45] Date of Patent: Mar. 29, 1994

[54] METHOD FOR REMOVING COMPOSITE ATTACHED TO MATERIAL BY DRY ETCHING

[75] Inventors: Nobuo Hayasaka, Kanagawa; Tsunetoshi Arikado; Haruo Okano, both of Tokyo; Keiji Horioka, Kanagawa, all of Japan

[73] Assignee: Kabushiki Kaisha Toshiba, Kawasaki, Japan

[21] Appl. No.: 996,864

[22] Filed: Dec. 15, 1992

Related U.S. Application Data

[63] Continuation of Ser. No. 531,399, Jun. 4, 1990, abandoned, which is a continuation-in-part of Ser. No. 237,031, Aug. 29, 1988, abandoned.

[30] Foreign Application Priority Data

Aug. 28, 1987 [JP] Japan .................................. 62-213082
Sep. 29, 1987 [JP] Japan .................................. 62-242660
Feb. 5, 1988 [JP] Japan .................................. 63-025155
May 30, 1988 [JP] Japan .................................. 63-130385

[51] Int. Cl.$^5$ ...................... H01L 21/306; B44C 1/22; C23F 1/00; B29C 37/00
[52] U.S. Cl. .................................. 156/643; 156/656; 156/657; 156/659.1; 156/662; 156/665; 156/668; 156/345; 252/79.1
[58] Field of Search ............... 156/643, 646, 656, 657, 156/659.1, 662, 665, 668, 640, 653, 345; 252/79.1

[56] References Cited

U.S. PATENT DOCUMENTS 4,734,152  3/1988  Geis et al. ............................ 156/345
4,749,440  6/1988  Blackwood et al. ................. 156/345
4,818,327  4/1989  Davis et al. .......................... 156/345

FOREIGN PATENT DOCUMENTS 3714144  12/1987  Fed. Rep. of Germany .

OTHER PUBLICATIONS

Patent Abstracts of Japan 58-137836, Aug. 16, 1983.
Patent Abstracts of Japan, 60-106132, Jun. 11, 1985.
Patent Abstracts of Japan, 60-53023 Mar. 26, 1985.
S. K. Ghandi V.L.S.I. Fabrication Principles, 1983 John Wiley & Sons, Inc. New York pp. 502 & 503.

Primary Examiner—William A. Powell
Attorney, Agent, or Firm—Foley & Lardner

[57] ABSTRACT

A method and apparatus for removing a composite attached to a material to be treated by dry ashing using a gas including a halogen element and a gas including a hydrogen element or using a gas including fluorine, a gas including oxygen and a gas including chlorine in a reaction chamber containing the material therein for use in manufacturing a semiconductor device.

36 Claims, 20 Drawing Sheets

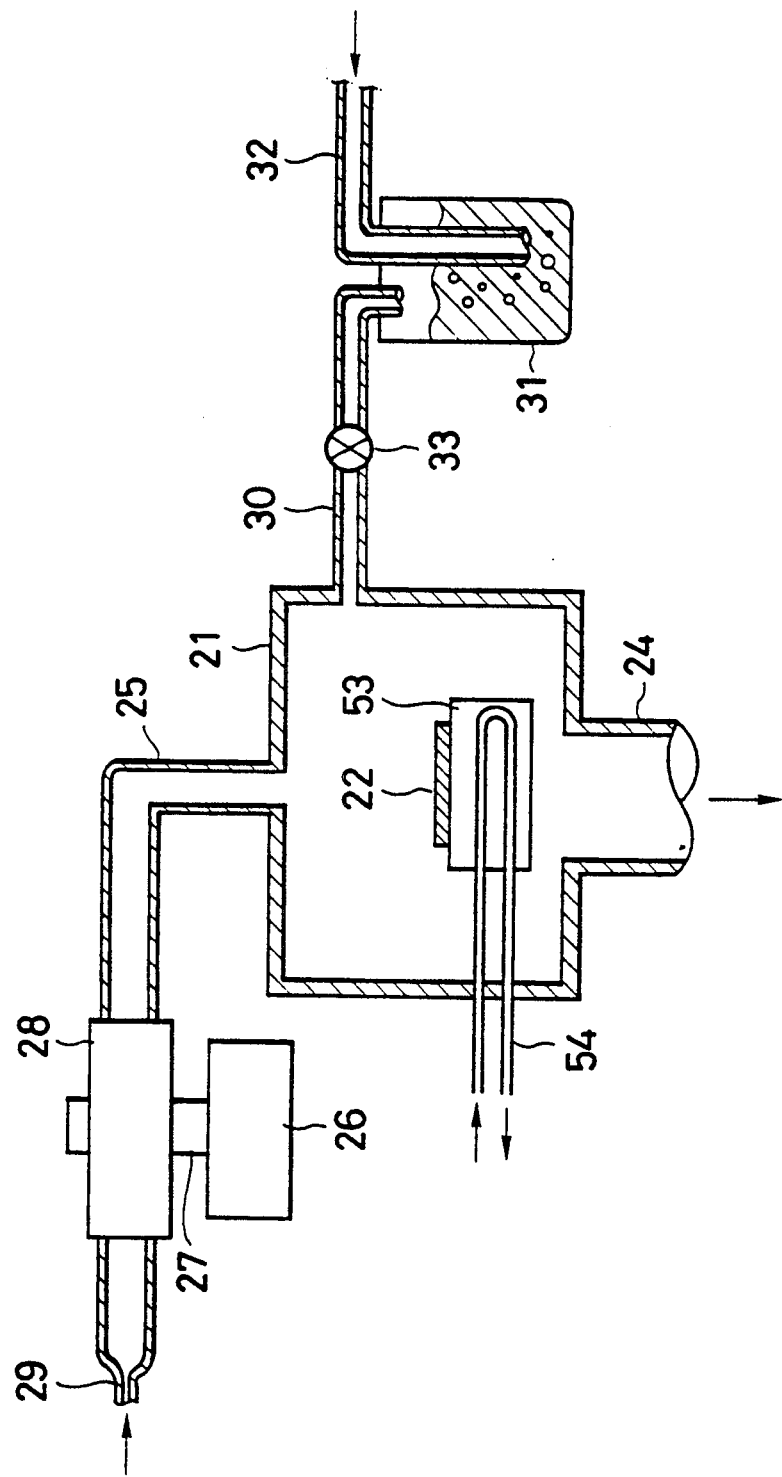

F I G. 17
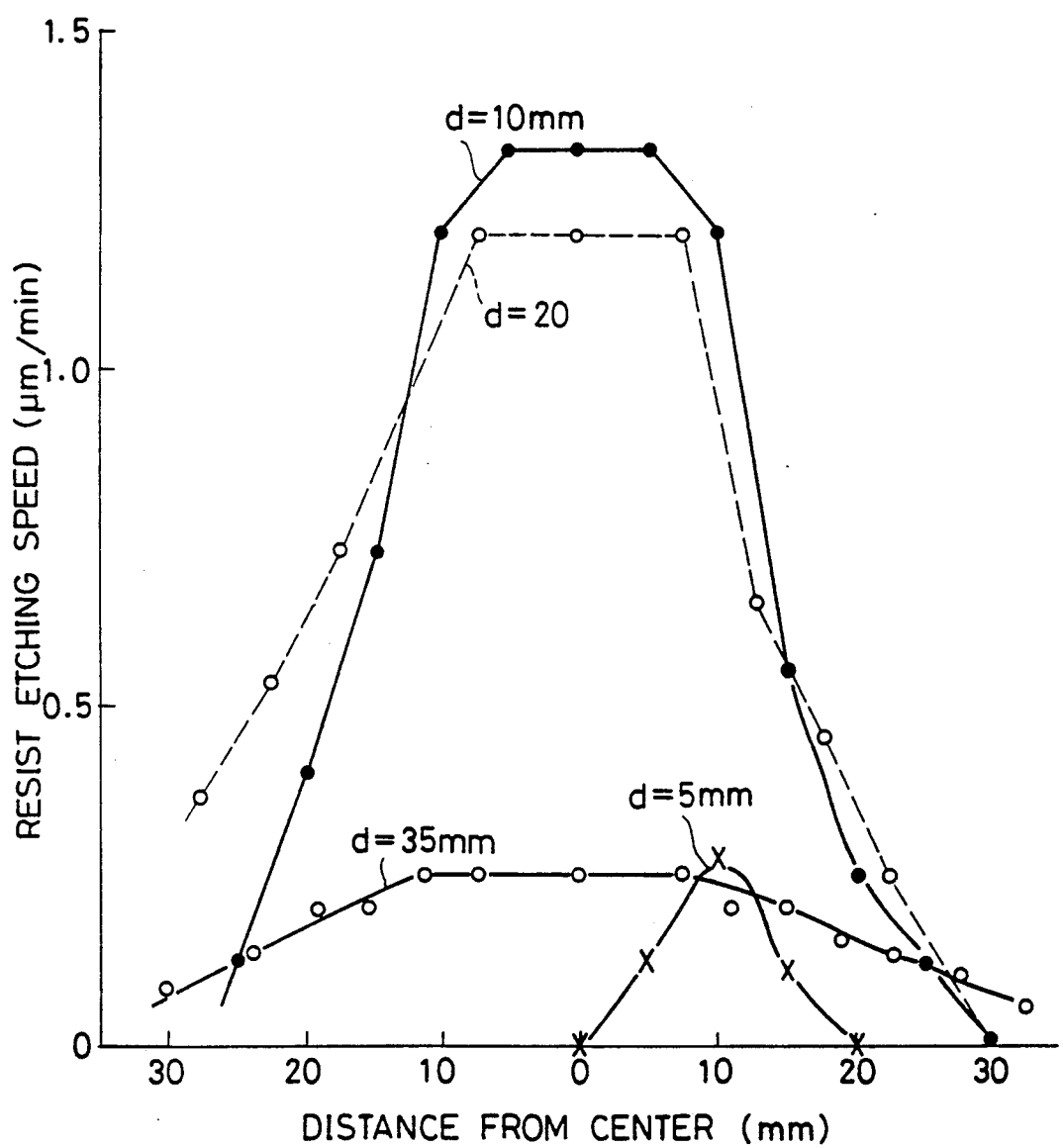

FIG.23(a)
FIG.23(b)
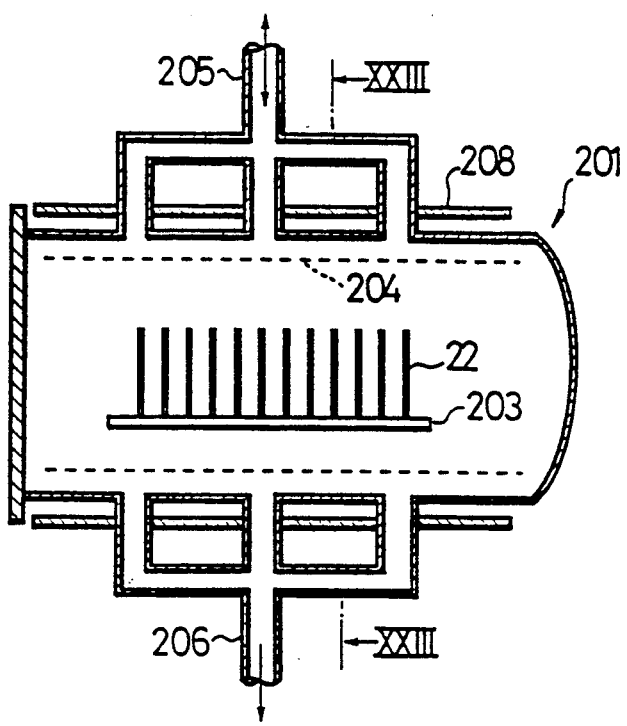
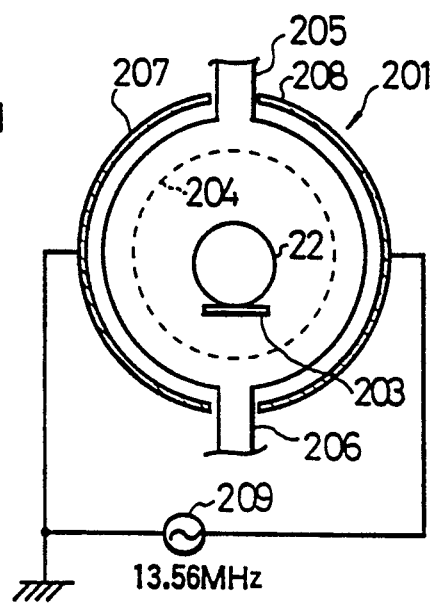
FIG.24
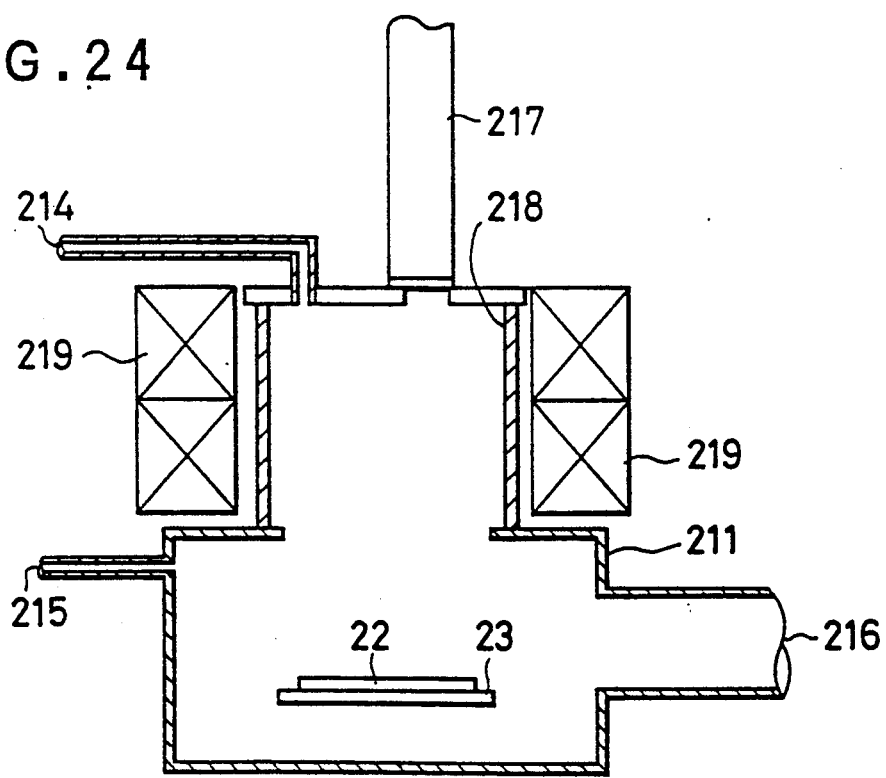

METHOD FOR REMOVING COMPOSITE ATTACHED TO MATERIAL BY DRY ETCHING

This application is a continuation of application Ser. No. 07/531,399, filed Jun. 4, 1990, abandoned, which is a continuation-in-part of application Ser. No. 07/237,031, filed Aug. 29, 1988, abandoned.

BACKGROUND OF THE INVENTION

1. Field of the Invention

The present invention relates to method and apparatus for removing a composite attached to a material to be treated by a dry etching for use in a photo resist or a surface treatment of a semiconductor manufacturing process or the like.

2. Description of the Background Art

In a conventional apparatus for manufacturing a semiconductor or the like, it is important and essential to conduct a photo etching process (PEP) with an organic compound film such as a photosensitive photoresist as a mask in finely processing a printed circuit board, a compact disc or a laser disc. Then, this organic compound photoresist is removed after finishing a processing such as an etching and an ion-implanting of a main plate or board. The removal of the photoresist is mainly carried out in a wet chemical etching process, e.g., in a mixed solution of a sulfuric acid and a hydrogen peroxide or another mixed solution of the former mixed solution and water added thereto, or in a dry plasma etching process, e.g., in a dry ashing with oxygen gas dissociated by discharge.

In the wet chemical etching process, there are some problems in controlling the acidic solution and the safety of the operation. Particularly, this process is not suitable for a process for manufacturing a semiconductor which dislikes a process using a liquid, and further, when an organic compound photoresist is used for patterning a metallic electrode material such as aluminum or the like in a semiconductor producing process, the metallic electrode can be eaten easily by the acidic mixed solution of the sulfuric acid and the hydrogen peroxide. Thus, the application of the wet chemical etching process is restricted.

In the dry plasma ashing process which removes the problems of the wet chemical etching process, the organic compound photoresist can be removed in the dry ashing by the oxygen plasma. In this case, a material to be etched is placed in a barrel type or parallel plate type reactor, and the oxygen gas introduced therein is dissociated by the discharge therein to produce the oxygen plasma. The organic compound photoresist is removed using the oxygen plasma. In this process, as compared with the wet chemical etching process, the processing is conducted in a simple way and the material to be etched is not limited to the nonmetallic materials. However, in the dry plasma ashing method, the electric discharge is practiced in the reactor containing the material to be treated in order to attain a certain removing speed in practice, and hence the material is damaged on its surface or a resist residue is produced on the surface.

An example of a process for producing a gate electrode on a semiconductor plate of a MOS semiconductor device in a conventional photo etching process using an oxygen plasma will be described in connection with FIG. 1.

First, a phosphorus-added polycrystalline silicon film 3 for a gate electrode is formed on a semiconductor base plate 1 via an oxide film 2 formed thereon, and an organic compound photoresist film 4 is applied over the polycrystalline silicon film 3, as shown in FIG. 1a. Then, a pattern light exposure is carried out and is then developed so as to obtain the desired partial resist film 4a on the gate electrode film 3, as shown in FIG. 1b. By utilizing the partial resist film 4a as a mask, a partial gate electrode film 3a right under the partial resist film 4a is left by etching the other part of the polycrystalline silicon film 3 in the reactive ion etching (RIE) process or the like, as shown in FIG. 1c. Finally, the partial photoresist film 4a is removed from the polycrystalline film 3a in the dry plasma ashing process using the aforementioned oxygen plasma, as shown in FIG. 1d.

However, when the partial photoresist film 4a is removed from the gate electrode film 3a, as shown in FIG. 1d, the residues 5 of the ashed organic compound may be often produced on the surfaces of the gate electrode film 3a and the oxide film 2. Further, by the attack of the charged particles produced by the discharge during the removing step of the photoresist film 4a, the damages may be caused in the oxide film 2 and the semiconductor plate 1. Accordingly, in the MOS semiconductor device produced as described above, the residues 5 may affect bad influences to the followed processes or the characteristics of the semiconductor, for example, the resistivity of the oxide film may be deteriorated.

These problems arise in both the barrel type and the parallel plate type ashing reactors. In the latter reactor, the charged particles mainly impact against the surface of the material to be removed during the discharge, and thus the damage of the material is larger than that in the former reactor.

Further, in the oxygen plasma ashing process, usually, the charged particle such as oxygen radical and ozone does not react with the photoresist of the material to be removed at a practical speed at a low temperature such as below approximately 100° C., and hence heat or another energy instead of the heat is added to the material placed in the plasma. When the material is heated, the inside of the photoresist is carbonized. Therefore, it is more difficult to remove the residues of the organic compounds exposed by the charged particles during the dry plasma ashing, and the residues are apt to remain on the surfaces of the material, in comparison with another process including no dry plasma ashing step.

In order to completely remove the residues 5, it is necessary to perform the oxygen plasma ashing for a long time, for instance, more than one hour, which is inconvenient and disadvantageous for realizing the manufacturing process, and further in such a long oxygen plasma ashing process, the damage to the material is enlarged. Then, the temperature in the reactor is raised to more than 100° C. for improving the etching rate, but this requires a large and complicated processing apparatus. Further, in turn, the residues are liable to be produced at the high temperature, and the residues cannot be completely removed.

On the other hand, nowadays, a pattern size of an integrated circuit for a semiconductor is remarkably diminished to such as a submicron order in a common process. As steps in a semiconductor manufacturing process proceed, a surface of a base plate becomes more uneven and more complicated. When a fine pattern is formed on the uneven and complicated surface of the plate, the dimensional accuracy is remarkably lowered. That is, the dimensions become smaller in the convex surface portions and larger in the concave surface portions.

In order to overcome this problem, a multilayer resist method has been developed. In this case, for instance, an aluminum film is applied over an uneven semiconductor base plate with an uneven aluminum surface, and then a first photoresist is overlaid on the uneven aluminum film with a flattened photoresist surface. Then, a thin film of a material such as silicon oxides having a resistance against the oxygen plasma is uniformly applied over the flat surface of the first photoresist, and a second photoresist is then evenly formed over the flat surface of the plasma-resistant film. The pattern light exposure and the developing of the second photoresist film are conducted to form the desired pattern thereof with an excellent dimensional accuracy because the surface of the second photoresist film is uniform, and then the etching of the plasma-resistant film is carried out in a certain direction, for example, perpendicular to the flat surface plane of the second photoresist, using the patterned second photoresist as the mask. Next, the first photoresist film is etched in the predetermined direction perpendicular to the flat surface plane of the plasma-resistant film, in the oxygen plasma ashing process using the plasma-resistant film as the mask to form a pattern having a high dimensional accuracy. Further, the etching of the aluminum film laid over the semiconductor plate is performed in the oxygen plasma ashing process using the patterned first photoresist film as the mask with an accurate etched pattern on the uneven semiconductor base plate in the same manner as above.

However, in the aforementioned etching processes using the oxygen plasma, the etched aluminum of the aluminum film is sputtered and attaches to the side walls of the patterned plasma-resistant film, the etched first photoresist and the etched aluminum film during the plasma ashing process.

FIG. 2 schematically illustrates an etching process of an aluminum film 13 applied over an oxide film 12 of a semiconductor base plate 11 using a patterned photoresist 14 laid on the aluminum film 13. In this embodiment, during the reactive ion etching process, a charged particle 16 perpendicularly impacts on the aluminum film 13 to sputter the aluminum film 13, and an etched aluminum spatter 17 attaches to the side walls of the photoresist 14 or the patterned aluminum layer 13a to form aluminum film walls 15 thereon, as shown in FIG. 2a. The aluminum film walls 15 can prevents the attacks of the charged particles and thus plays an important roll to form a precise and fine pattern. However, after the aluminum pattern forming by etching using the photoresist as the mask is finished, the photoresist 14 can be removed by the dry plasma ashing process, but the aluminum film walls 15 cannot be removed, as shown in FIG. 2b.

Such film walls of a material to be etched may be formed regardless of the kind of the material during the dry plasma ashing process. For instance, when a polycrystalline silicon is etched, silicon film walls are formed in the same manner as the aluminum film walls when the aluminum material is etched, as described above. Usually, the aluminum film walls can be removed in the wet chemical etching treatment, for example, using an etching solution including a hydrofluoric acid, but, at the same time, the aluminum pattern and the insulating material of silicon oxide film below the aluminum pattern can also be etched in the etching solution. In the case of the polycrystalline silicon, the gate oxide film under the polycrystalline silicon pattern can be etched as well.

When a halogen radical having a strong reactivity, obtained by activating a gas including halogen element or elements such as fluorine is used for etching, the halogen radical can solely react with the organic compound film to remove it. However, when the photoresist or the gate electrode formed on the silicon or silicon oxide base film is etched by the halogen radical alone, the base film is also etched, and hence the halogen radical alone cannot be used for the etching process. Further, the etching rate of the organic compound film using the halogen radical alone becomes approximately 1000 Å/min which is not so quick, in practice.

SUMMARY OF THE INVENTION

Accordingly, it is an object of the present invention to provide a method for removing an organic or inorganic film in a dry etching, free from the aforementioned defects and disadvantages of the prior art, which is capable of quickly and exactly removing a photoresist and side walls formed on sides of an etched pattern by attaching etched material spatters thereto during the etching, in a dry process to obtain a pattern having an excellent dimensional accuracy without giving any damages against the pattern and a base plate under the pattern.

In accordance with one aspect of the invention, there is provided in a dry etching method for removing a composite attached to a material to be treated, for use in manufacturing a semiconductor device, the method comprising the steps of activating a first gas including a halogen element to obtain a neutral reactive gas, introducing the neutral reactive gas into a reaction chamber containing the material therein, and introducing a second gas including at least hydrogen element into the reaction chamber to remove the composite from the material.

In accordance with another aspect of the invention, there is provided in a dry etching method for removing a composite attached to a material to be treated, for use in manufacturing a semiconductor device, the method comprising the steps of introducing a first gas including a halogen element into a reaction chamber containing the material, activating the first gas to obtain a neutral reactive gas in a reaction chamber, and introducing a second gas including at least hydrogen element into the reaction chamber to remove the composite from the material.

In accordance with a further aspect of the invention, there is provided in a dry etching method for removing a composite attached to a material to be treated for use in manufacturing a semiconductor device, the method comprising the steps of introducing a first gas including fluorine radical into a reaction chamber containing the material therein, introducing a second gas including oxygen radical into the reaction chamber, and introducing a third gas including chlorine radical into the reaction chamber to remove the composite from the material, the third gas introducing step being carried out after the first and second gas introducing steps.

In accordance with a still another aspect of the invention, there is provided in a dry etching method for removing a composite attached to a material to be treated for use in manufacturing a semiconductor device, the method comprising the steps of introducing a first gas including fluorine into a reaction chamber containing the material therein, activating the first gas to obtain a fourth gas including fluorine radical in the reaction chamber, introducing a second gas including oxygen into the reaction chamber, activating the second gas to obtain a fifth gas including oxygen radical in the reaction chamber, introducing a third gas including chlorine into the reaction chamber, and activating the third gas to obtain a sixth gas including chlorine radical in the reaction chamber to remove the composite from the material, the third gas introducing step being carried out after the first and second gas introducing steps.

BRIEF DESCRIPTION OF THE DRAWINGS

These and other objects, features and advantages of the present invention will more fully appear from the description of the preferred embodiments with reference to the accompanying drawings, in which:

FIG. 6 is a schematic longitudinal cross sectional view, like FIG. 3, of a second embodiment of the apparatus including a cooling device for a material according to the present invention;

FIG. 17 is a graphical representation showing a relation between a photoresist etching speed and a distance from the center on the surface of the material to be etched using the nozzle of FIG. 16;

FIG. 23a is a schematic longitudinal cross sectional view of an eighth embodiment of the apparatus according to the present invention and FIG. 23b is a longitudinal cross sectional view, taken along the line XXIII-–XXIII in FIG. 23a;

FIG. 24 is a schematic longitidinal cross sectional view of a ninth embodiment of the apparatus according to the present invention;

DESCRIPTION OF THE PREFERRED EMBODIMENTS

Figure 1A:
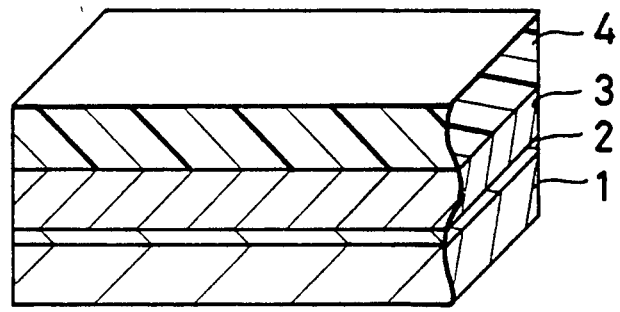
FIGS. 1(a)-1(d) are schematic perspective views showing a conventional plasma etching process.
Figure 1B:
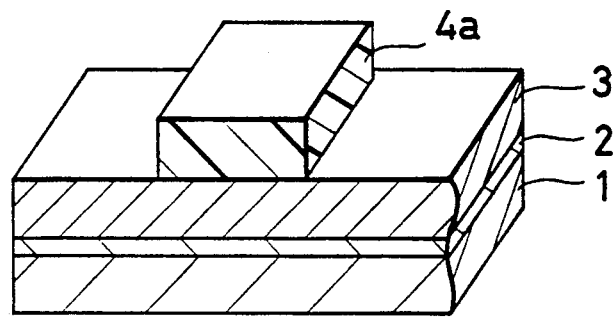
Figure 1C:
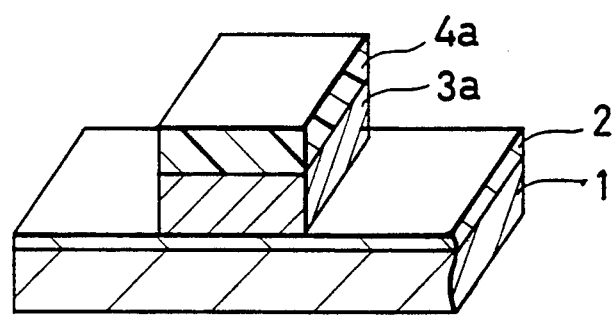
Figure 1D:
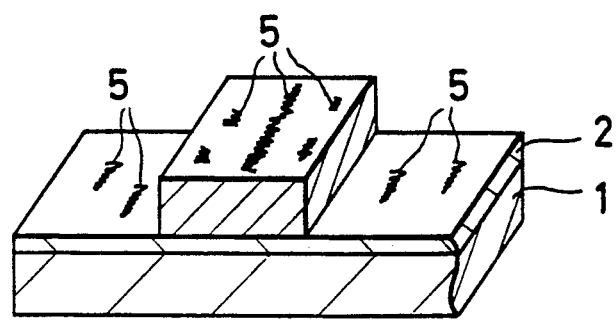
Figure 2A:
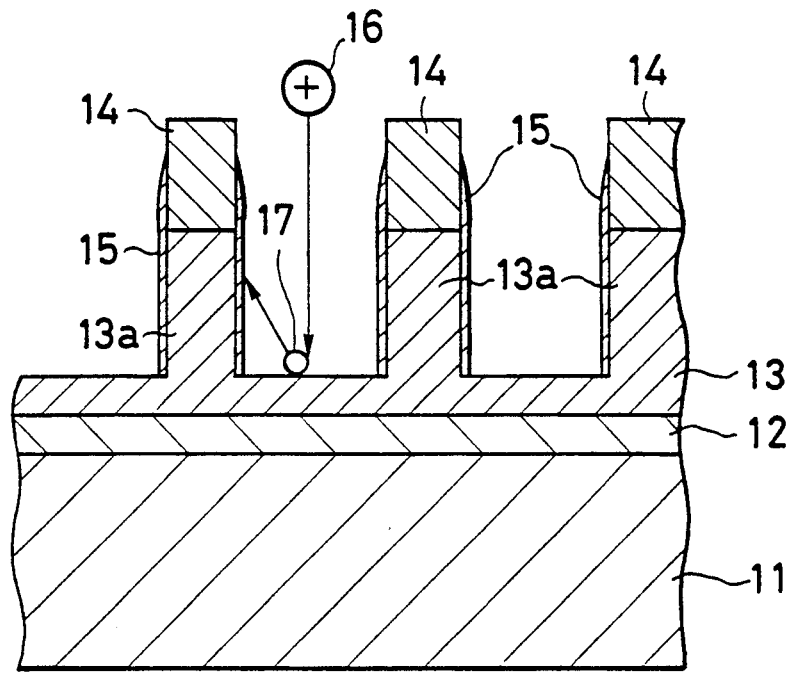
FIGS. 2(a)-2(b) are schematic longitudinal cross sectional views showing another conventional etching process.
Figure 2B:
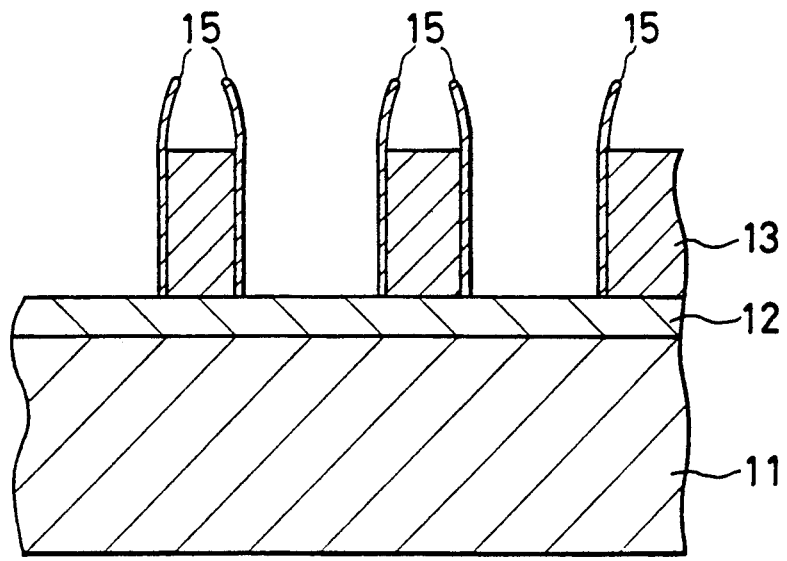
Figure 3:
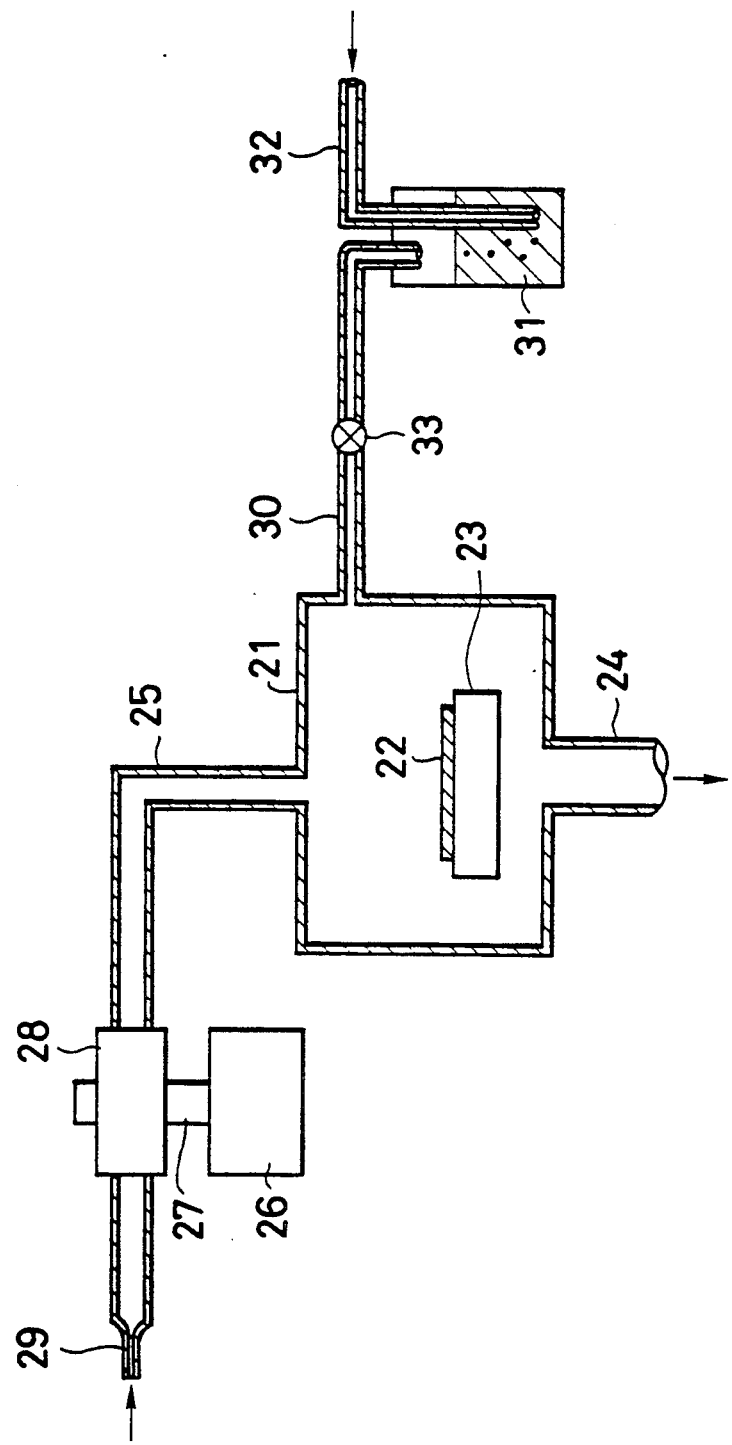
FIG. 3 is a schematic longitudinal cross sectional view of a first embodiment of an apparatus for removing a composite attached to a material to be treated according to the present invention.

Referring now to the drawings, wherein like reference characters designate like or corresponding parts throughout the several views, there is shown in FIG. 3 a first embodiment of an apparatus for removing organic and inorganic film by a dry etching according to the present invention.

In the drawing, the down-flow type apparatus comprises a reaction chamber 21 for containing a material 22 to be etched, mounted on a table 23, an outlet pipe 24 for exhausting the gas from the chamber 21, attached to the bottom of the chamber 21, the outlet pipe 24 being connected to a vacuum pump (not shown), a first inlet pipe 25 connected to the central top of the chamber 21, for supplying a gas including halogen element or elements, for instance, fluorine (F) element or the like, into the chamber 21, a microwave generator 26 for supplying a microwave to a discharge tube 28 via a wave guide 27, the discharge tube 28 being attached to and surrounding a part of the first pipe 25, and a second inlet pipe 30 attached to upper side wall of the chamber 21, for supplying another gas or gases including at least hydrogen, for example, hydrogen ($H_2$), water vapor ($H_2O$), steam, alcohols, hydrocarbons or the like, into the chamber 21.

In this embodiment, the gas including halogen or halogens such as fluorine is introduced into an end 29 of the first pipe 25, and the introduced gas is activated in the discharge tube portion of the first pipe 25 to feed the activated gas into the chamber 21. A carrier gas such as hydrogen is introduced into a container 31 containing a solution such as the water or an alcohol therein through a pipe 32 to bubble in the solution, and the water vapor or the alcohol vapor gas along with the carrier gas are supplied from the container 31 into the chamber 21 through the second pipe 30. The second pipe 30 is provided with a valve 33 for controlling a flowing amount of the gas passing therethrough. The container 31 may be provided with a controller for controlling the temperature of the solution in the container 31.

In this case, when the gas having a low vapor pressure, such as the water vapor, is introduced into the chamber 21, the carrier gas may be effectively used. When the hydrogen gas, the gas including at least a hydrogen element is introduced into the chamber 21 through the second pipe 30, it may be directly introduced into the second pipe 30 without passing through the container 31.

Figure 4A:
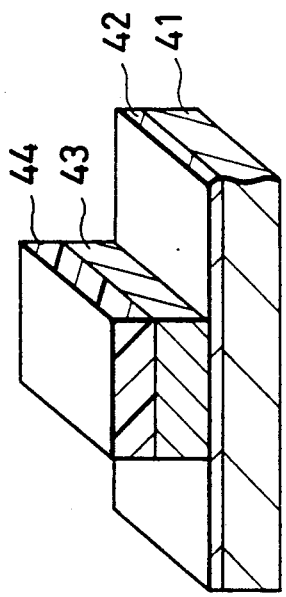
FIGS. 4(a)-4(b) are schematic perspective views showing an etching process of a specimen, conducted in the apparatus shown in FIG. 3.

Then, an operation of the apparatus of FIG. 3 will be described. In this embodiment, nitrogen trifluoride ($NF_3$) and the hydrogen gas are used as the gas including fluoride (F) and the carrier gas, respectively. In FIG. 4a, there is shown a material 22 to be etched, of which a gate electrode 43 made of a material such as polycrystalline silicon or aluminum is formed on a semiconductor base plate 41 via a gate oxide film 22 formed thereon using a photoresist pattern film 44 made of an organic compound material as a mask by the reactive ion etching (RIE) in a MOS semiconductor manufacturing process.

The material shown in FIG. 4a is set on the table 23 in the reaction chamber 21. Then, the nitrogen trifluoride ($NF_3$) gas is introduced into the first pipe 25 through its end 29 and is activated therein by operating the discharge tube 28 to feed fluoride radicals through the first pipe 25 into the chamber 21, and, on the other hand, the hydrogen gas is fed into the chamber 21 along with the water vapor carried on the hydrogen gas through the pipe 32, the container 31 and the second pipe 30. In this embodiment, the flowing amounts or pressures of the gas including the nitrogen trifluoride gas and the hydrogen gas are determined to a fixed value such as 0.1 Torr, but they may be properly varied depending on the desired practical etching speed and selection ratio so as not to etch the base film under the photoresist or the gate electrode to be etched.

Figure 4B:
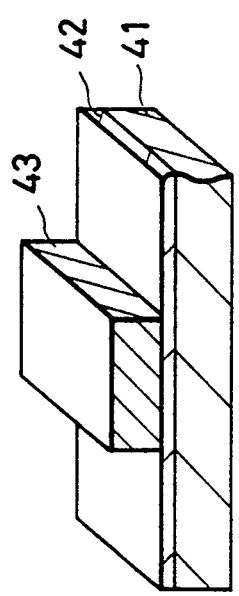

When the material was treated under the conditions described above, the removal of the photoresist was finished in approximately three minutes with a high photoresist removing speed of 7000 Å/min. The residues were completely removed, i.e., no residue was produced and found on the gate electrode 43 and the gate oxide film 42 of the finished material 22, as shown in FIG. 4b.

In this embodiment, instead of the hydrogen gas, another carrier gas such as argon (Br), nitrogen ($N_2$), oxygen ($O_2$) or the like may be used, and instead of the water vapor gas and the hydrogen carrier gas, the water vapor gas only, the gas including at least a hydrogen element such as an alcohol $CH_3OH$, $C_2H_5OH$ or the like, a hydrocarbon $CH_4$, $C_2H_6$ or the like may be used.

Further, instead of the nitrogen trifluoride ($NF_3$), another gas for generating activated halogen such as $SF_6$, $CF_4$, $C_2F_6$, $C_3F_8$, $CF_4+O_2$, $C_2F_6+O_2$, $C_3F_8+O_2$, $XeF_2$, $F_2$ or the like, like those used in the chemical dry etching process, may be used. Further, for the gas generating halogen, $Cl_2$, $CCl_4$, $SiCl_4$, $PCl_3$, $BCl_3$, $Br_2$, $CBr_4$, $CBrF_3$, $I_2$, $CFCl_3$, $CF_2Cl_2$, $CF_3Cl$, $F_3Cl$, $FCl_3$, $ClF_5$, $SiF_4$, and the like may be used according to the present invention.

In this embodiment, when the activated halogen such as activated fluorine and the water vapor gas, the hydrogen gas or the gas including at least hydrogen are supplied into the chamber at the same time, the etching speed of the silicon (Si) or the silicon oxide ($SiO_2$) which is etched when only the halogen radical is fed, becomes naught, and, in turn, the etching speed of the organic compound film becomes quite faster such as 5000 Å/min. It is considered that the halogen radical reacts with the water vapor gas or the like, and the produced radical such as hydrogen radical, OH radical or HF radical can readily reacts with the organic compound, but does not react with the inorganic compound such as the silicon and the silicon oxide. Therefore, the high organic compound removal can be performed with a very high selection ratio of etching with respect to the inorganic compound such as silicon and silicon oxide.

In this embodiment, the flowing amounts or pressures of the gas including the halogen or activated halogen and the gas including the hydrogen can be determined to a certain suitable range, and they can be properly varied depending on the desired practical etching speed and selection ratio so as not to etch the base film under the photoresist or the gate electrode to be etched. For instance, such flowing amounts or pressures can be determined depending on a pressure of which the electric discharge is carried out or, when using the water vapor, a pressure at which a dew condensation may not occur. Further, the gas including the activated halogen and the gas including the hydrogen may be supplied into the chamber at the same time or separately at different times.

Figure 5:
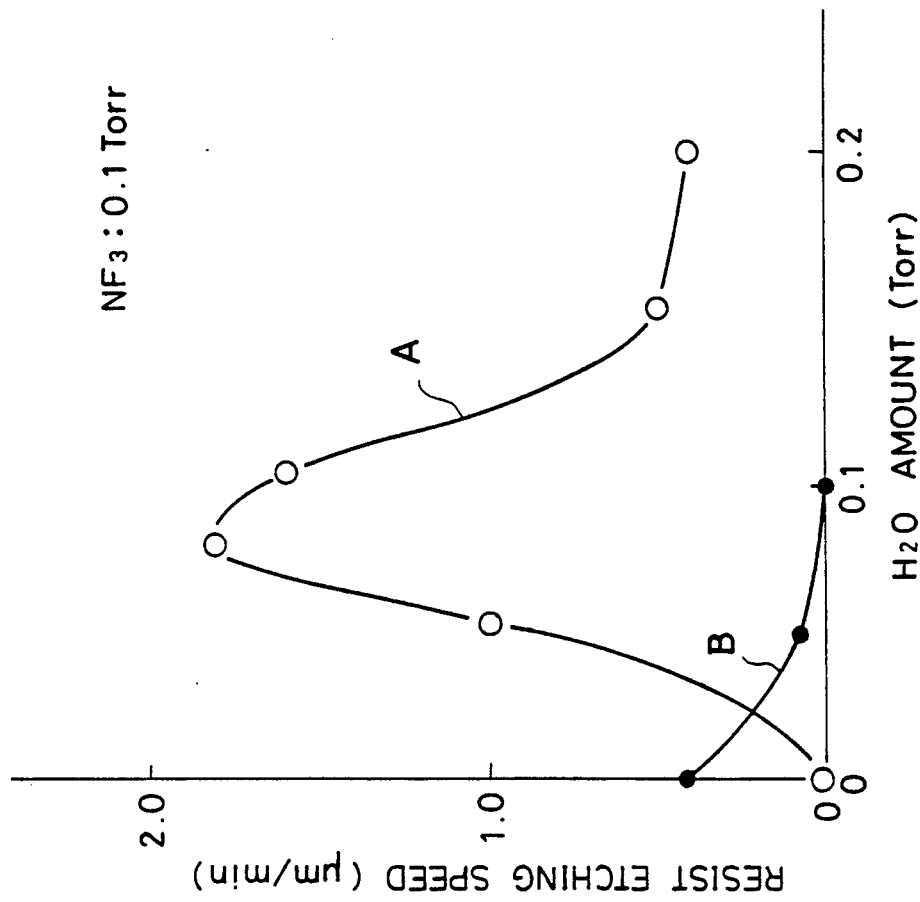
FIG. 5 is a graphical representation showing a relation between a photoresist etching speed and a variation of water supplied in the apparatus of FIG. 3.

FIG. 5 shows the photoresist etching speed of the material to be treated in the above described process according to the present invention when the water supply amount is varied. It is readily understood from this characteristics graph that the etching speed of the organic compound photoresist is increased as the water amount is increased to approximately 0.08 Torr, and then is decreased as the water amount is increased further, that the etching speed of the organic compound photoresist is large enough between 0.05 Torr and 0.13 Torr of the water amount, as shown by a curve A, and that the etching speed of the polycrystalline silicon is reduced as the water amount is increased, and becomes naught when the water amount is at least 0.1 Torr, as shown by a curve B. Accordingly, when the water amount is 0.1 Torr, the ideal photoresist removing characteristics can be obtained in the present process. Hence, it is clear that the addition amount of the water vapor gas, the gas including hydrogen is largely related to the organic compound photoresist removing speed, and this addition amount can be properly selected, as shown in FIG. 5.

When the base film is aluminum film, the aluminum film cannot be etched by the halogen radical such as fluorine radical, and thus there happens no problem. Further, the halogen radical has a very long life, and hence may be produced apart from the reaction chamber and then fed therein. In the present method, the water vapor, the gas including hydrogen to be supplied into the reaction chamber may not be required to activate, and thus the material to be treated is completely separated from the activating device and is not damaged at all thereby in comparison with the oxygen plasma ashing process.

The present invention may be applied to a parallel plate type apparatus, and in such an apparatus, an anode-coupled type or a three electrodes type apparatus may be employed so as to prevent the material to be treated from the attack of high-speed charged particles, thereby preventing the damage of the material.

The present process described above may be utilized in various applications such as a dry cleaning of the surface of the material which is contaminated by an organic compound or the like.

In FIG. 6, there is shown a second embodiment of the apparatus according to the present invention, having the same construction as the embodiment shown in FIG. 3, except that a table 53 for supporting the material 22 to be processed is provided with a cooling device comprising a cooling pipe 54 for cooling the table 53 and thus the material 22 placed on the table 53. A conventional coolant such as the water, ethylene glycol, oils, gases and the like may be used for the cooling device.

In this embodiment, the nitrogen trifluoride ($NF_3$) gas is introduced as the gas including fluorine into the first pipe 25 to supply the activated gas into the chamber 21 in the same manner as the first embodiment, and the water in the container 31 is directly introduced into the chamber 21 in the form of the water vapor gas through the second pipe 30 without using any carrier gas. The removal of the photoresist is carried out in the same manner as the first embodiment, as shown in FIG. 4. In this case, the partial pressures of the nitrogen trifluoride gas and the water vapor are determined to a fixed value such as 0.1 Torr, but they may be properly changed depending on the desired practical etching speed and selection ratio so as not to etch the base film under the photoresist or the gate electrode to be etched.

The removal of the photoresist will be conducted under these conditions after the gate electrode made of aluminum or aluminum compound is etched using the photoresist (OFPR-800, Trade Name of Tokyo Applied chemical company) as the mask in the reactive ion etching process. When this photoresist removal is carried out without cooling the material 22, the photoresist temperature rises more than 100° C. in approximately one minute after the reaction gases are introduced into the chamber and the ashing of the photoresist is started. In approximately one minute initial processing, almost all photoresist can be removed, but the residues are produced on the aluminum electrode and the oxide film, as described hereinbefore in the conventional process in connection with FIG. 1. In order to completely remove the residues, at least five minutes treating time is required.

According to the present invention, the table 53 is cooled to keep the temperature of the material 22 to approximately 0° C. during the ashing of the photoresist, the photoresist can be completely removed in approximately three minutes without producing any residue on the electrode and the oxide film. This processing time is reduced to half in comparison with the treatment without cooling. In this embodiment, of course, the same effects and advantages as those resulted in the first embodiment described above can be obtained.

Figure 7:
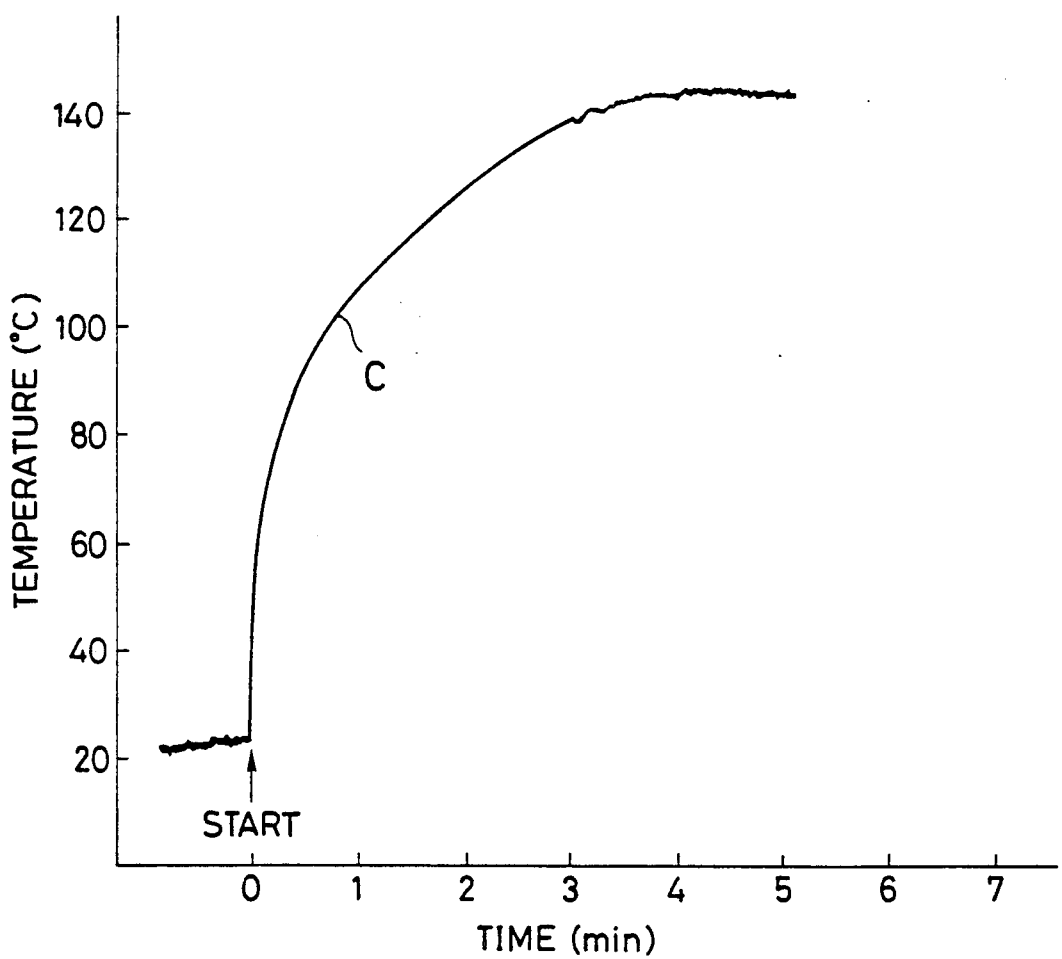
FIG. 7 is a graphical representation showing a relation between a photoresist temperature and an ashing time in the apparatus of FIG. 6.

FIG. 7 shows a curve C representing the relation between the photoresist temperature and the processing time, and it is found that as the ashing proceeds the photoresist temperature is raised more than 150° C. in five minutes, and the photoresist temperature rise causes an important factor for producing the residues on the material during the ashing.

Figure 8:
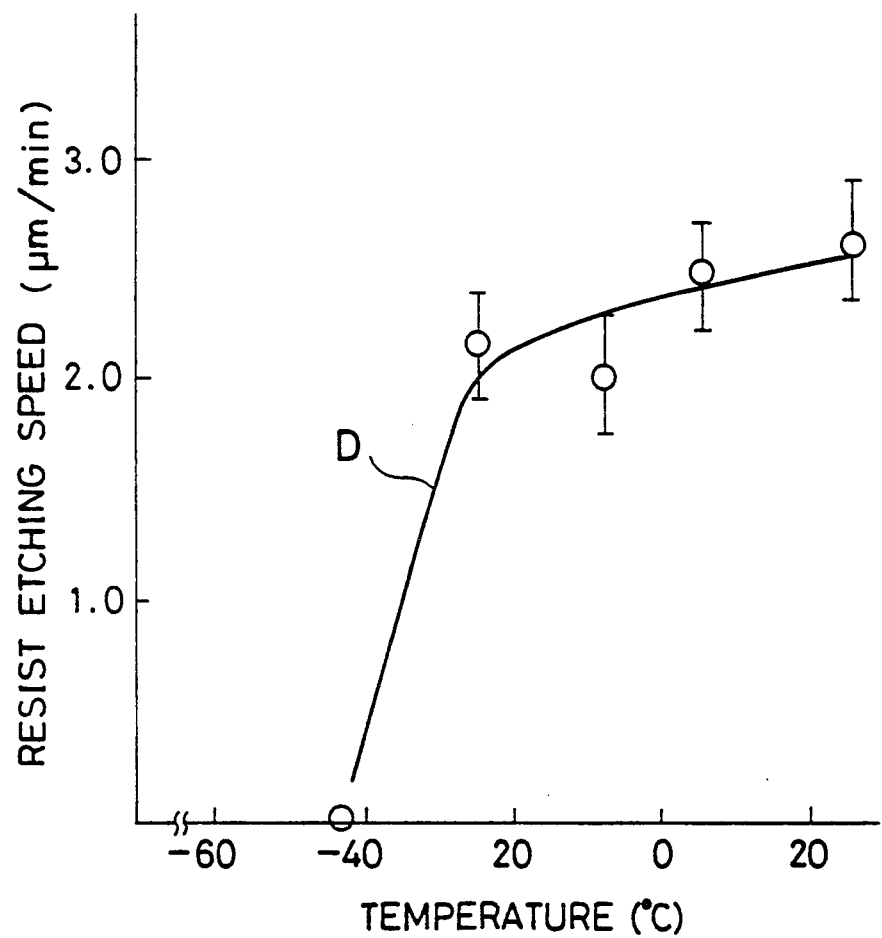
FIG. 8 is a graphical representation showing a relation between a photoresist etching speed and a temperature of a material in the apparatus of FIG. 6.

However, in the ashing process using the halogen radical such as fluorine radical, the photoresist temperature rise is not essential, the ashing can proceed at low temperature. FIG. 8 schematically illustrates a curve D which represents the relation between the photoresist etching speed and the temperature of the material to be treated in the dry ashing process using nitrogen trifluoride ($NF_3$) and the water vapor gas ($H_2O$) which are separately introduced into the reaction chamber, as described above. From FIG. 8, it is apparent that the practically quick etching speed may be obtained even when the temperature of the material is lowered under the room temperature. In FIG. 8, the ashing speed is rapidly fallen to the naught under $-40°$ C., and this is caused by the dew condensation of the water on the material.

In this embodiment, by using the carrier gas set forth in the first embodiment described above, the same effects and advantages can be obtained. Further, other gases aforementioned in the first embodiment may be used as the gas including halogen such as fluorine, and the hydrogen, the gas including hydrogen, aforementioned in the first embodiment, may be also used instead of the water vapor gas.

Figure 9:
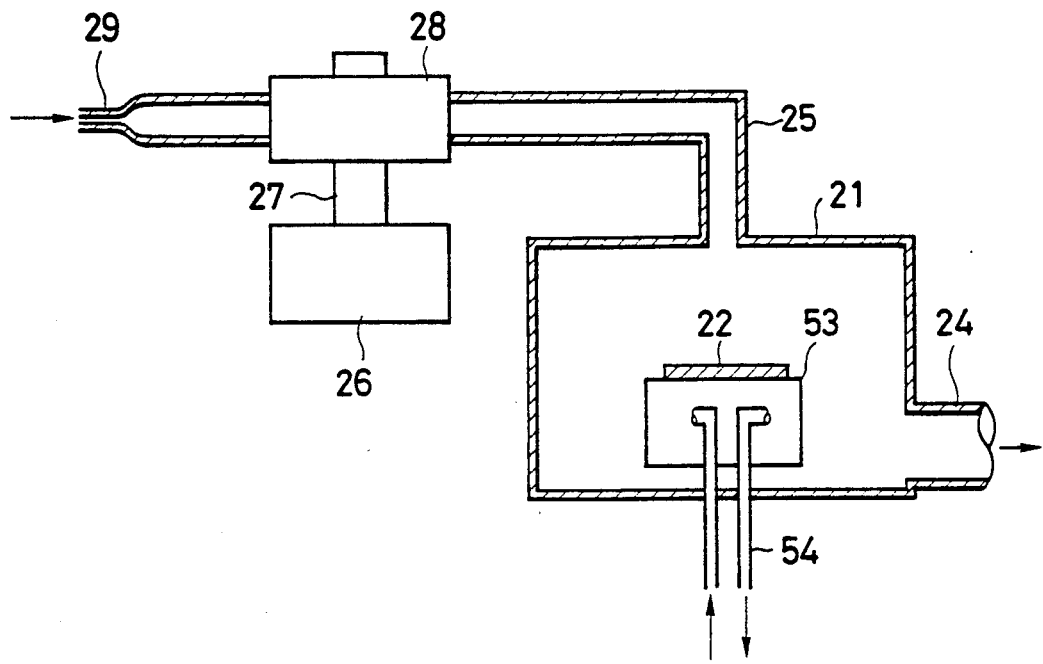
FIG. 9 is a fragmentary longitudinal cross sectional view, like FIG. 6, of a third embodiment of the apparatus according to the present invention.

In FIG. 9, there is shown a third embodiment of the apparatus according to the present invention, having substantially the same structure as the second embodiment shown in FIG. 6, except the second pipe of the second embodiment is omitted and the outlet pipe 24 is attached to the side wall of the chamber 21. In this embodiment, carbon tetrafluoride ($CF_4$) and the oxygen gas are used as the gas including the halogen and the gas including at least the oxygen element, respectively. The mixture gas of carbon tetrafluoride and the oxygen gas is introduced into the first pipe 25 and is activated by the discharge tube 28 to feed the activated gas into the chamber 21 in the same manner as the first embodiment. In this case, the carbon tetrafluoride and the oxygen gas are mixed in respective flowing amounts of 10 sccm and 100 sccm, and their partial pressures are determined to 0.2 Torr.

Then, the same material 22 as the one treated in the second embodiment is processed in the same manner as the second embodiment, as described above. In the treatment without cooling the material 22, the photoresist temperature rises more than 150° C. in approximately one minute after the start, and almost all photoresist can be removed in approximately one minute initial processing. However, the residues are produced on the aluminum pattern and the oxide film, and may not be often removed after more than ten minutes treatment. In this case, the etching speed of the silicon oxides is quite slow, but the silicon oxide can also be removed a quite little for a long period of treatment. Hence, when a very thin silicon oxide film is used as a base film, a problem may be liable to happen. Further, there is no problem when the ashing of the photoresist formed on the aluminum film is conducted, but, when the photoresist laid on the polycrystalline silicon pattern is removed by ashing, since the polycrystalline silicon film can be etched easier than the silicon oxide film, the treatment cannot be carried out for a long time.

When the material 22 is treated, according to the present invention, while the material 22 is cooled in the same manner as the second embodiment, the same effects and advantages as those of the second embodiment can be obtained. Although the carbon tetrafluoride ($CF_4$) is used as the gas including the fluorine (F) in this embodiment, nitrogen trifluoride ($NF_3$), perfluoroethane ($C_2F_6$), perfluoropropane ($C_3F_8$), xenone difluoride ($XeF_2$), sulfur hexafluoride ($SF_6$) or the like may be used in the same manner, with the same effects and advantages of the third embodiment described above.

Figure 10:
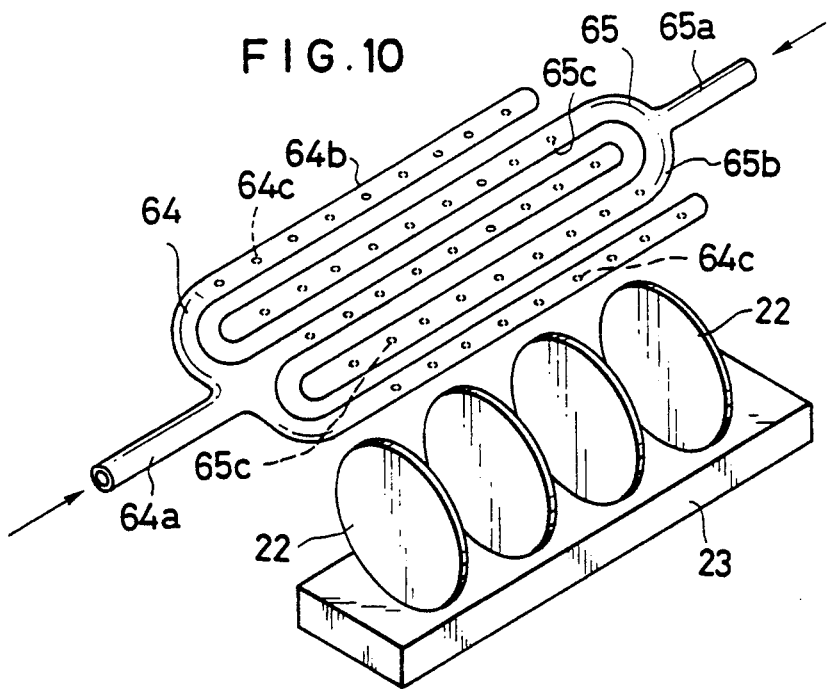
FIG. 10 is a perspective view of a first embodiment of nozzles for supplying gases to the material to be etched in the apparatus according to the present invention.

In FIG. 10, there is shown a first embodiment of first and second nozzles 64 and 65 for supplying the gases to a plurality of materials 22 such as wafers or the like, mounted on the table 23, for use in the apparatuses shown in FIGS. 3 and 6.

In the drawing, the first nozzle 64 includes a main tube 64a and three branch tubes 64b with openings 64c facing downwards, through which the gas is supplied toward the materials 22. The second nozzle 65 includes a main tube 65a and two branch tubes 65b with openings 65c facing downwards, through which the gas is supplied toward the materials 22. The main tubes 64a and 65a of the first and second nozzles 64 and 65 may be connected to the first and second pipes 25 and 30 of the apparatuses shown in FIGS. 3 and 6. For instance, the activated gas including fluorine is supplied to the first nozzle 64, and another gas such as the water vapor, the hydrogen gas, the gas including at least hydrogen is supplied to the second nozzle 65.

The branch tubes 64b of the first nozzle 64 and the branch tubes 65b of the second nozzle 65 are alternately arranged in parallel with one another in order to well mix the gases supplied from the openings of the branch tubes 64b and 65b and to uniformly apply the well-mixed gases toward the materials 22. Accordingly, the gases supplied from the different tubes 64 and 65 are mixed well, and the well-mixed gases are evenly applied toward the materials 22 to be etched, resulting in performing the uniform etching or ashing of the materials.

Figure 11:
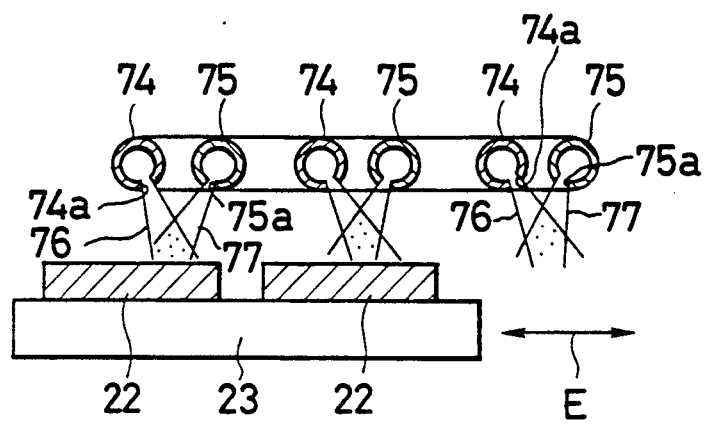
FIG. 11 is a schematic longitudinal cross sectional view of a second embodiment of the nozzles used in the apparatuses according to the present invention.

In FIG. 11, there are shown a second embodiment of first and second nozzles 74 and 75 having the similar constructions to those of the first embodiment shown in FIG. 10, for use in the same manner as the first embodiment. The first and second nozzles 74 and 75 including respective openings 74a and 75a for discharging the gases are alternately arranged in parallel with one another in the similar manner to the first embodiment of FIG. 10. The openings 74a and 75a of the adjacent first and second nozzles 74 and 75 are designed to open somewhat inside directions at a certain angles so as to well and uniformly mix the different gases discharged from the openings 74a and 75a.

In this case, the table 23 for supporting the materials 22 to be processed may be movable with respect to the first and second nozzles 74 and 75 thereunder in a plane parallel with the plane where the first and second nozzles 74 and 75 are arranged, as indicated by an arrow E in FIG. 11, using a drive means such as a motor (not shown), in order to uniformly apply the well-mixed gas toward the materials 22. Hence, in this case, the concentration of the supplied gases may be partially raised, and, since the materials 22 are moved relative to the openings 74a and 75a of the first and second nozzles 74 and 75 so as to apply the mixed gas to the entire surfaces of the materials 22, the uniform and quick etching can be performed.

Figure 12:
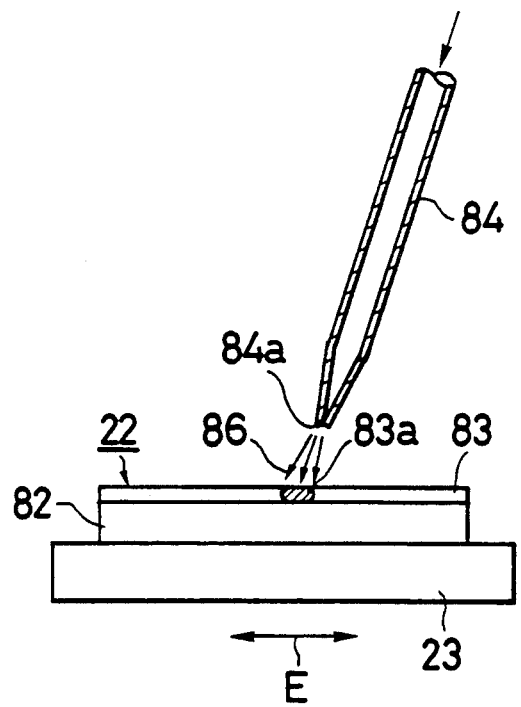
FIG. 12 is a schematic longitudinal cross sectional view of a third embodiment of the nozzle used in the apparatuses according to the present invention.

In FIG. 12, there is shown a third embodiment of a nozzle 84 having a small opening 84a in its lower end, and the table 23 for supporting the material 22 which comprises a semiconductor base plate 82 and an organic compound film 83 formed thereon. The nozzle 84 is somewhat inclined with respect to the vertical line perpendicular to the surface of the material 22, and the table 23 is movable in the same manner as the one shown in FIG. 11, as indicated by the arrow E in FIG. 12. In this case, one of the two kinds of gases is firstly fulfilled in the chamber 21, and then the other gas 86 is supplied from the small opening 84a of the nozzle 84 toward a small portion 83a to be treated of the organic compound film 83, thereby partially etching a small area of the material 22. When the table 23 is moved during the etching of the material 22, the material 22 can be treated in a linear form.

Figure 13:
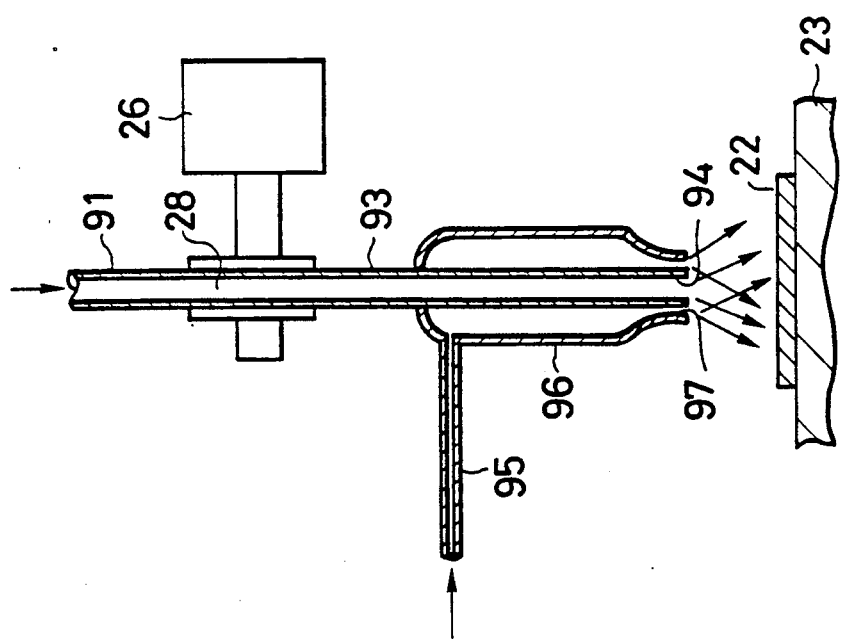
FIG. 13 is a longitudinal cross sectional view of a fourth embodiment of the nozzle used in the apparatuses according to the present invention.

In FIG. 13, there is shown a fourth embodiment of a double tube nozzle, for example, made of quartz, which comprises an inner tube 93 having an opening 94 and an outer tube 96 having an annular opening 97, the outer tube 96 concentrically surrounding the inner tube 93. The end portion of outer tube 96 is tapered off. This double tube nozzle may be arranged within the chamber 21 of FIGS. 3 and 6. The inner tube 93 is connected to the first pipe 91 through the discharge tube 28, and the outer tube 96 is coupled to the second pipe 95. The gases are supplied toward the material 22 mounted on the table 23 from the openings 94 and 97 of the inner and outer tubes 93 and 96 through the first and second pipes 91 and 95.

Figure 14A:
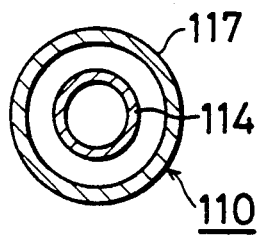
FIGS. 14(a)-14(b) are transverse cross sectional views of embodiments of an opening portion of the nozzle of FIG. 13.
Figure 14B:
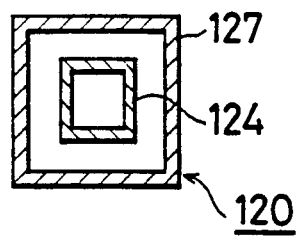

In FIG. 14, there are shown two cross sections of two embodiments of the end portion of the double tube nozzle shown in FIG. 13. As shown in FIG. 14a, the end portion 110 of the nozzle comprises inner and outer concentric circular tubes 114 and 117. As shown in FIG. 14b, the end portion 120 of the nozzle comprises inner and outer concentric square tubes 124 and 127. In this case, by using these nozzles, the gases can be uniformly applied to the material 22, which is advantageous and convenient.

When the gas including the halogen such as fluorine is fed to the inner tube 114 or 124 and the water vapor, the gas including hydrogen is supplied to the outer tube 117 or 127, the gas including the halogen does not readily affect or attach to the unrelated portions such as the wall of the chamber 21 other than the material 22. In turn, the gas including the halogen can be effectively applied to the desired portion such as the organic compound film of the material 22, resulting in improving the photoresist removing or etching efficiency.

Further, by properly selecting the flowing amounts or the flowing speeds of the gases, the gas including the halogen may be supplied to the outer tube 117 or 127 and the water vapor, the gas including hydrogen may be fed to the inner tube 114 or 124.

Figure 15A:
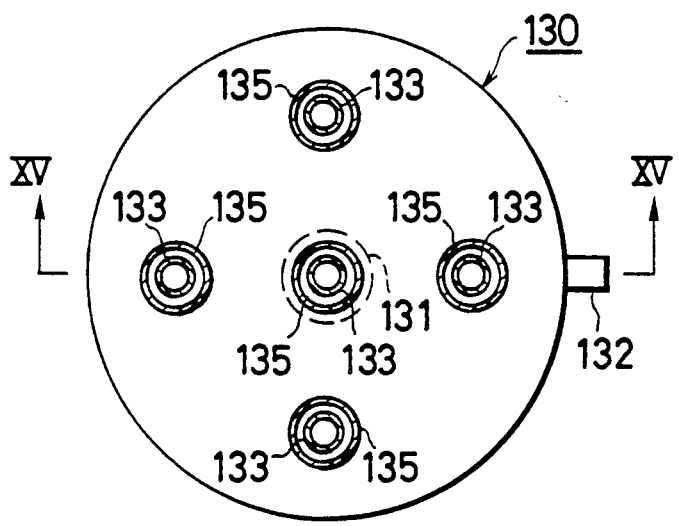
FIGS. 15(a)-15(b) show a fifth embodiment of a nozzle including a plurality of the nozzles shown in FIG. 13.
Figure 15B:
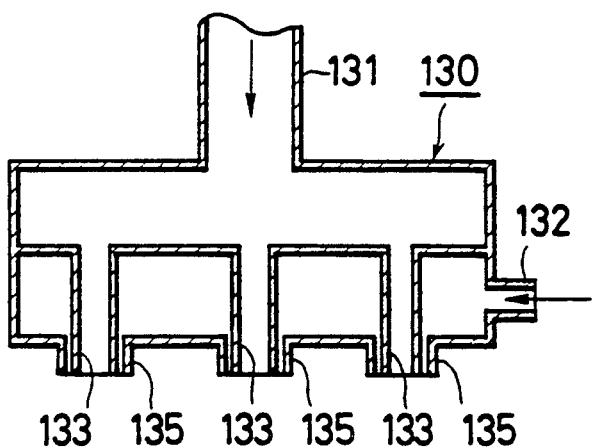

FIG. 15 shows a fifth embodiment of a nozzle or nozzle unit 130 made of quarts, including a plurality of double tube nozzles similar to the nozzle 110 shown in FIG. 14a. FIG. 15a is an elevational view of the nozzle 130 and FIG. 15b is a longitudinal cross sectional view, taken along the line of XV–XV in FIG. 15a. The nozzle unit 130 comprises five double concentric circular tube nozzles, each nozzle comprising an inner tube 133 and an outer tube 135, a first pipe 131 connected to the inner tubes 133, and a second pipe 132 connected to the outer tubes 135. The gases are introduced into the first and second pipes 131 and 132 in the same manner as the fourth embodiment shown in FIG. 13. By using this nozzle unit 130, the material 22 such as a wafer having a large surface area can be effectively and uniformly treated. For instance, when 5 inches of wafers were processed using this nozzle unit 130 while the carbon tetrafluoride ($CF_4$) was fed to the nozzle unit 130, the organic compound photoresist formed on the surfaces of the wafers was removed at the etching speed of more than 7000 Å/min on the surfaces of the wafers without producing any residue thereon.

Figure 16:
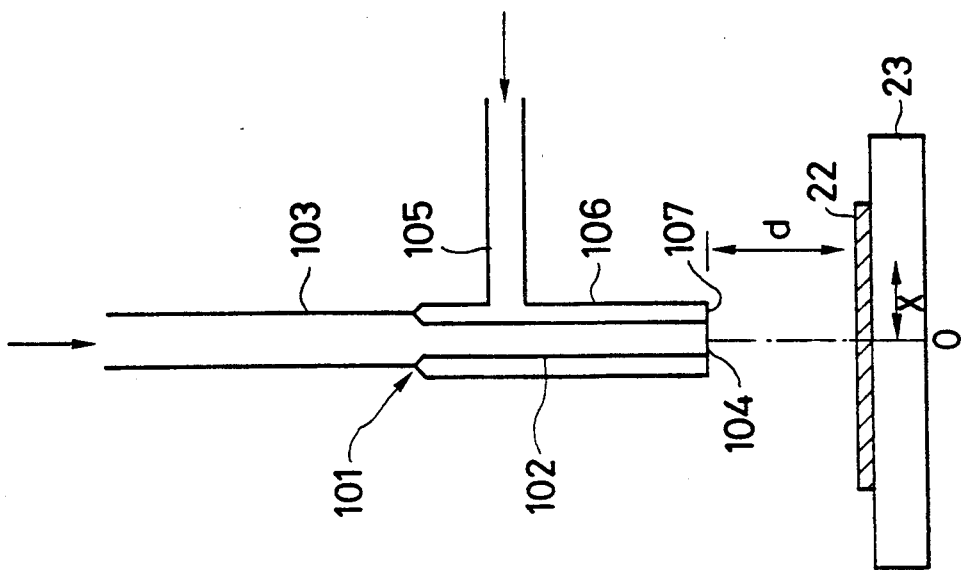
FIG. 16 is a longitudinal cross sectional view of a sixth embodiment of the nozzle used in the apparatuses according to the present invention.

In FIG. 16, there is shown sixth embodiment of a nozzle 101 of the double concentric circular tube type, which comprises an inner tube 102 having an opening 104 in its lower end, connected to a first pipe 103, and an outer tube 106 having an annular opening 107 in its lower end, connected to a second pipe 105. In this case, for example, the gas including the halogen is supplied to the first pipe 103, and the water vapor, the gas including hydrogen is fed to the second pipes 105 in the same manner as the above embodiments to feed the gases from the openings 104 and 107 of the inner and outer tubes 102 and 106 toward the material 22 mounted on the table 23. The nozzle 101 is vertically arranged above the flattened material 22 to be treated at a distance d apart from the material 22, and the central axis of the nozzle 101 passes through the center 0 of the material 22.

For example, the etching of the photoresist of the material 22 was carried out by feeding the nitrogen trifluoride ($NF_3$) with its flowing amount or pressure of 30 sccm and the water vapor or gas ($H_2O$) with its flowing amount or pressure of 0.075 Torr (total pressure of 0.15 Torr) into the inner and outer tubes 102 and 106, respectively, to obtain four curves representing a relation between a photoresist etching speed and a distance x away from the center 0 of the material 22 while the distance d between the surface of the material 22 and the opening end 104 and 107 of the nozzle 101 is varied to 5 mm, 10 mm, 20 mm and 35 mm, as shown in FIG. 17. In this embodiment, the diameter of the inside wall of the inner tube 102 was approximately 6 mm, and the diameters of the inner and outer inside walls of the outer tube 106 are approximately 8 mm and 10 mm, respectively.

It is readily understood from FIG. 17 that, when the distances d between the material 22 and the opening end of the nozzle 101 are 10 mm and 20 mm, the photoresist can be etched at a quick etching speed, in practice, but, when the distances d between the material 22 and the opening end of the nozzle 101 are 5 mm and 35 mm, not so quick etching speed can be obtained, and that the photoresist etching can be effectively performed within approximately 10 mm apart from the center O of the material 22. It is considered from this example that, when the distance d is 5 mm, the two gases discharged from the openings 104 and 107 of the inner and outer tubes 102 and 106 are not mixed so well, and that, when the distance d is 35 mm, the most activated radicals die a natural death or lose the activities until they reach the material 22.

Figure 18:
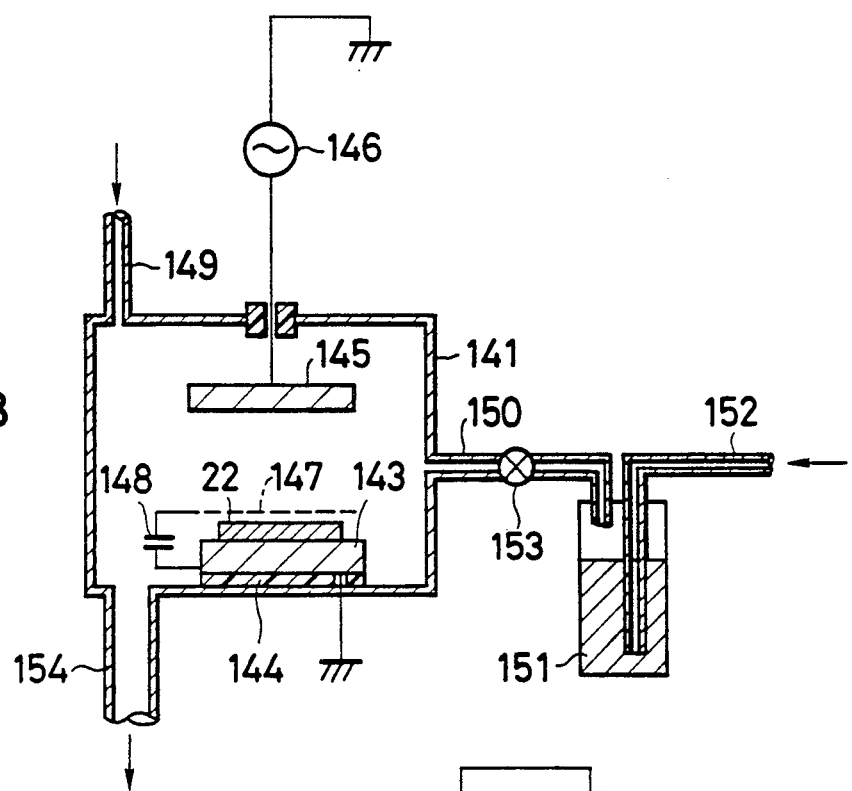
FIG. 18 is a schematic longitudinal cross sectional view of a fourth embodiment of the apparatus including a parallel plate electrodes according to the present invention.

In FIG. 18, there is shown a fourth embodiment of the apparatus according to the present invention, which is of a parallel plate type dry etching apparatus. A reaction chamber 141 contains a material 22 mounted on an anode electrode plate 143 which is secured to the bottom of the chamber 141 via an insulating material 144, and a cathode electrode plate 145 is arranged above the anode electrode plate 143 in parallel thereto in the chamber 145. An electric power source 146 for generating a high frequency wave is connected between the two anode and cathode electrodes 143 and 145 of the parallel plate type to generate an electric discharge therebetween for placing the material in the plasma produced by the discharge. The chamber 141 is provided with a first inlet pipe 149 for supplying the gas including the halogen, a second inlet pipe 150 for feeding the the gas including hydrogen through another pipe 152 and a container 151 containing the water on one side wall, and an outlet pipe 154 to be connected to a vacuum pump, for discharging the gas in the chamber 141 on the bottom.

In this embodiment, the material 22 having the organic compound film thereon is preferably mounted on the anode electrode plate 143, or the power to be supplied between the two electrodes 143 and 145 may be reduced. Alternatively, a mesh or net 147 made of a metallic material such as aluminum, nickel, platinum or the like and is electrically connected to the anode electrode 143 via a battery 148, may be arranged between the two electrodes 143 and 145 so as to cover the surface of the material 22, as shown in FIG. 18, thereby preventing the material 22 from the damage by the plasma during the discharge.

In this case, the gas including the halogen and the gas including the hydrogen are separately or simultaneously supplied to the reaction chamber 141, and then the electric charge is generated between the two electrodes 143 and 145 for generating halogen radicals to effect the etching of the material 22, with a result of a quick removal of the organic compound film of the material 22. In this case, the quick etching can be carried out, and thus the electric discharge may be generated in a small intensity in order to prevent the damage on the material 22.

Figure 19:
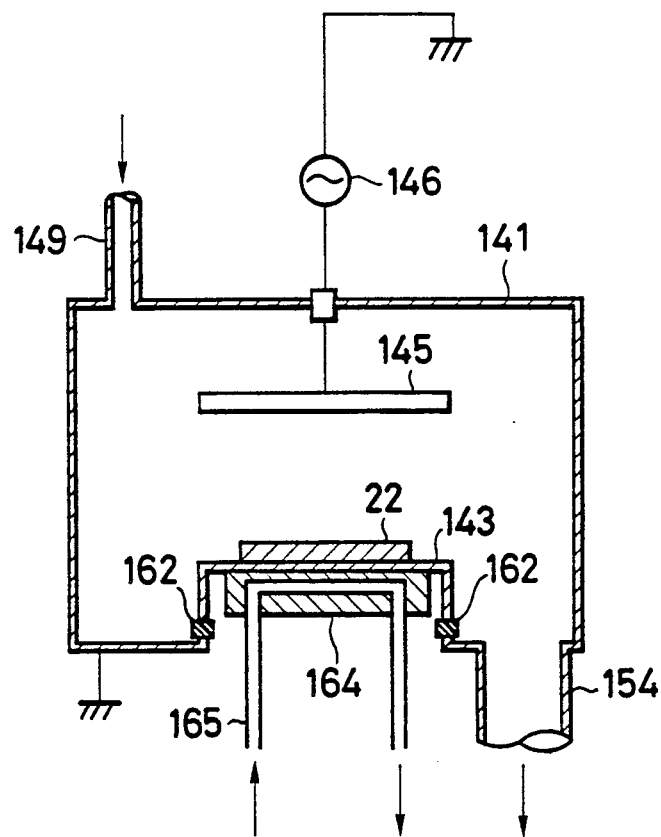
FIG. 19 is a schematic longitudinal cross sectional view, like FIG. 18, of a fifth embodiment of the apparatus including a cooling device for the material to be etched according to the present invention.

In FIG. 19, there is shown a fifth embodiment of a parallel plate type apparatus according to the present invention, having the same construction as the embodiment shown in FIG. 18, except that a support member 164 for supporting the anode electrode 143 is provided with a cooling device including a cooling pipe 164 for cooling the anode electrode 143 and thus the material 22 mounted thereon, and the second inlet pipe of the fourth embodiment is omitted.

By using this apparatus, the ashing of the photoresist of the material 22 was carried out by supplying the mixed gas of carbon tetrafluoride ($CF_4$) and the oxygen ($O_2$) ($O_2$:50 sccm; $CF_4$:3 sccm) at a pressure of 0.5 Torr while the electric discharge is generated between the two electrodes 143 and 145 by applying a high frequency (13.56 MHz) of a power (500 W) from the power source 146. When the temperature of the support member 164 was not controlled by cooling during the processing, the temperature of the material is raised up to approximately 200° C., and the residues are produced on the material after the ashing of the material. But, when the support member 164 is cooled to keep the temperature of the material 22 to approximately 0° C., the ashing of the material 22 is completed without producing any residue.

Figure 20:
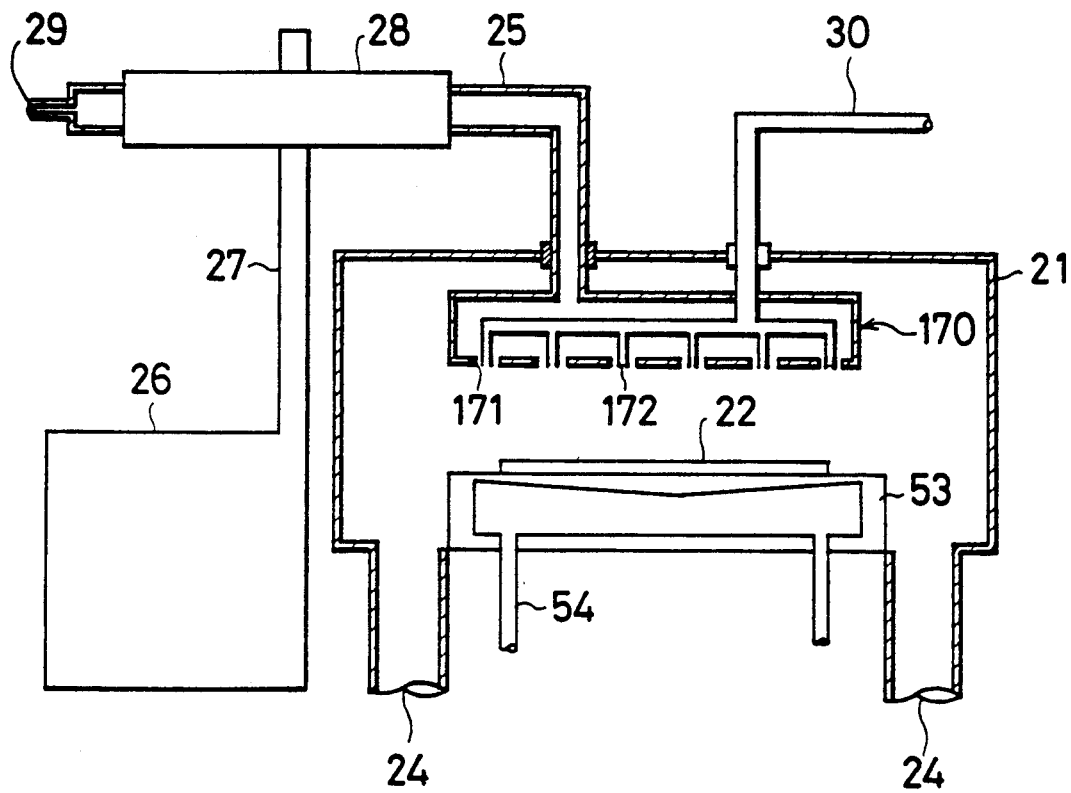
FIG. 20 is a schematic longitudinal cross sectional view of a sixth embodiment of the apparatus according to the present invention.

In FIG. 20, there is shown a sixth embodiment of the apparatus according to the present invention, which is capable of performing a dry etching process. The construction of this apparatus is basically the same as the one of the second embodiment described above in connection with FIG. 6, and thus the description of the same members can be omitted for the brevity. In this case, a nozzle unit 170 is secured to the upper wall of the chamber 21 and is provided with a plurality of double concentric tube type nozzles which includes outer tubes having openings 171 and inner tubes having openings 172. The outer and inner tubes of the nozzle unit 170 are connected to the first and second pipes 25 and 30, respectively. A pair of outlet pipes 24 are connected to right and left sides of the bottom of the chamber 21. The gases are introduced into the chamber 21 through the first and second pipes 25 and 30 and the outer and inner openings 171 and 172 of the outer and inner tubes of the nozzle unit 170 in the same manner as the above described embodiments.

FIG. 21 schematically shows an etching process of the material 22 using the apparatus shown in FIG. 20. First, a silicon oxide film 182 having a thickness of approximately 0.8 micrometer is formed on a P-type silicon base plate 181 by a wet oxidization process or the like, and then an aluminum film 183 having a thickness of approximately 0.8 micrometer is formed on the silicon oxide film 182 by the sputtering or the like. Then, a positive photoresist film pattern 184 is formed on the aluminum film 183 in the conventional manner, to obtain the material 22 shown in FIG. 21a.

Figure 21A:
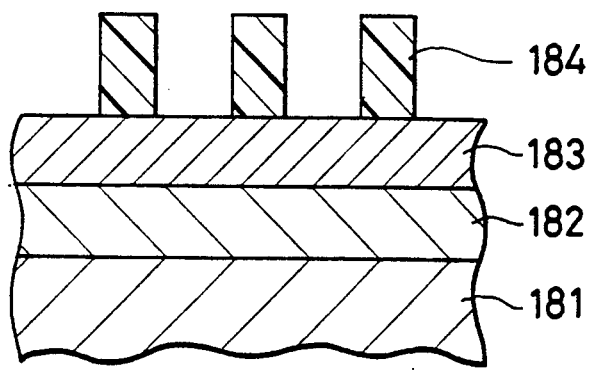
FIGS. 21(a)-21(d) are schematic longitudinal cross sectional views showing an etching process performed in the apparatus of FIG. 20.
Figure 21B:
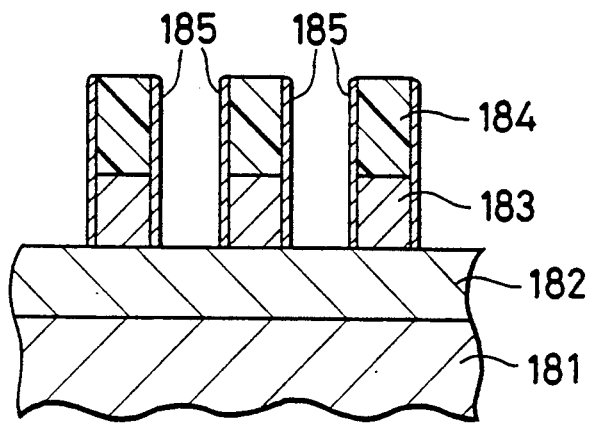

Then, the aluminum film 183 of the material 22 in FIG. 21a is etched using the photoresist film pattern 184 as the mask in an anisotropic etching such as the reactive ion etching. During the etching process, film walls 185 are formed on the side walls of the photoresist film pattern 184 and the patterned aluminum film 183, as shown in FIG. 21b. This reactive etching process is carried out by using a mixture gas of chlorine and boron trichloride under the conditions such as 60% of chlorine flow amount of the total flow amount, 0.06 Torr of etching pressure, and 0.8 W/cm$^2$ of the applied high frequency electric power. Other specimens of the material 22 are also prepared by forming molybdenum, tungsten, titanium, tantalum, hafnium or siliside thereof film instead of the aluminum film 183.

After the analysis of the film walls 185 formed on the material 22 during the etching process, it is found that the film walls 185 comprises ingredients of aluminum, carbon and silicon. It is considered that concerning the aluminum, the aluminum sputtered from the aluminum film 183 of the material 22 attaches again on the material, that as to the silicon, the aluminum film 183 is, in fact, a silicon alloy including approximately 1% of silicon or the silicon oxide film 182 under the aluminum film 183 is sputtered and is mixed into the film walls 185, and that relating the carbon, it is produced by the decomposition of the organic compound photoresist 184 and is mixed into the film walls 185.

Figure 21C:
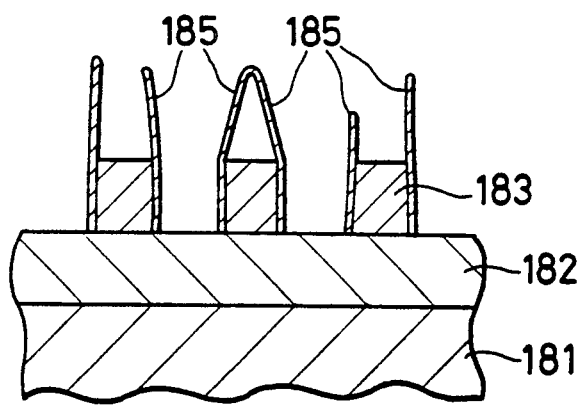

When the removal of the photoresist film 184 of the material 22 shown in FIG. 21b was performed using a conventional oxygen dry plasma ashing apparatus and the finished material was observed by using a scanning electron microscope (SEM) to find that the film walls 185 could not be removed, as shown in FIG. 21c.

According to the present invention, the silicon, the carbon and the aluminum in the film walls 185 of the material 22 are successively removed by the fluorine radical, the oxygen radical and the chlorine radical, respectively, and the photoresist 184 is simultaneously removed by the oxygen radical as the carbon is removed, in the dry ashing process, thereby completely and clearly removing the photoresist 184 and the film walls 185 in the same time without producing any residue.

The material 22 shown in FIG. 21b or FIG. 21c was treated using the apparatus shown in FIG. 20 as follows. First, the mixture gas of the Freon-14 (Trade Name) including the carbon tetrafluoride ($CF_4$) and the oxygen ($O_2$) gas was introduced into the first pipe 25 to keep its pressure to approximately 0.2 Torr, and the microwave power source 26 is operated to apply 200 W of microwave to the discharge tube 28 in order to generate the electric discharge for activating the gas in the first pipe 25. Since the formed fluorine radicals have a quite long life, they can be fed into the chamber 21 as they are alive. This step is continued for approximately five minutes for removing the silicon.

Then, the nitrogen trifluoride ($NF_3$) was introduced into the first pipe 25 to keep its pressure to approximately 0.2 Torr, and the microwave power source 26 is operated to apply the 200 W of microwave to the discharge tube 28 in the same manner as the previous step. In the same time, the water vapor ($H_2O$) was introduced into the second pipe 30 for producing the oxygen radicals. The ratio between the two gases was determined to 1:1. This step is continued for approximately three minutes.

Figure 21D:
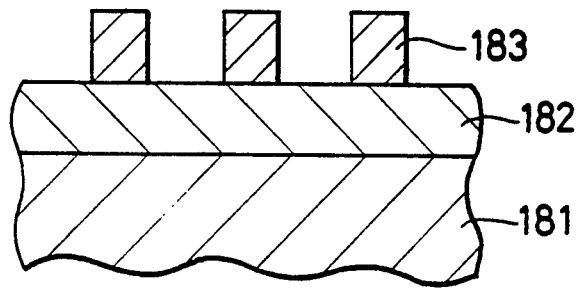

Lastly, the chlorine ($Cl_2$) gas was introduced into the first pipe 25 to keep its pressure to approximately 0.2 Torr, and the microwave power source 26 is operated to apply the 200 W of microwave to the discharge tube 28 in the same manner as the previous step in order to supply the activated chlorine radicals into the chamber 21. Then, the treated material 22 is taken out of the chamber 21 and is observed using the SEM to find that the photoresist 184 and the film walls 185 of the material 22 could be completely and clearly removed without producing any residue, as shown in FIG. 21d.

In this embodiment, the order of the first and second steps may be changeable, and boron trifluoride ($BF_3$), perfluoroethane ($C_2F_6$), perfluoropropane ($C_3F_8$), xenon difluoride ($XeF_2$), sulfur hexafluoride ($SF_6$) or the like can be, of course, used as the gas including fluorine. It has confirmed that in the second step, any gases for generating oxygen radical such as oxygen ($O_2$), carbon monoxide (CO), carbon dioxide ($CO_2$), nitrogen monoxide ($N_2O$), nitric monoxide (NO), nitrogen dioxide ($NO_2$), nitrogen trioxide ($N_2O_3$) or the like may be used, and that in the third step, any gases for generating chlorine radical such as carbon tetrachloride ($CCl_4$), boron trichloride ($BCl_3$), phosphorus trichloride ($PCl_3$) or the like may be used in principle.

In general, when the material 22 is processed by the gas including the activated fluorine, the gas including the activated oxygen and the gas including the activated chlorine, the effects and advantages of the present invention can be obtained. However, as to the aluminum, since the aluminum is oxidized by the oxygen in the air to become alumina, the aluminum can not be readily removed by the chlorine radical. Therefore, it becomes important to determine the order of the treatments using the radicals. That is, when the silicon is firstly removed from the material 22 by the fluorine radical and then the photoresist and the carbon are ashed by the oxygen radical, since the silicon and the carbon in the film are removed, the films to be removed become fragile and weak. The remained aluminum becomes in the form of a continuous connection of islands, as formed in the initial step of the film coating process, and the surface area of the aluminum is highly enlarged, i.e., the aluminum becomes extremely active. Thus, the remained aluminum may be readily removed by the chlorine radical. Accordingly, the photoresist removing process is preferably performed in the order described above. Further, other specimens of the material 22, prepared by forming the film using molybdenum, tungsten, titanium or siliside thereof instead of the aluminum film 183, can be effectively treated in the same manner as described above, with the result of the same effects and advantages as those of the aluminum film.

Figure 22:
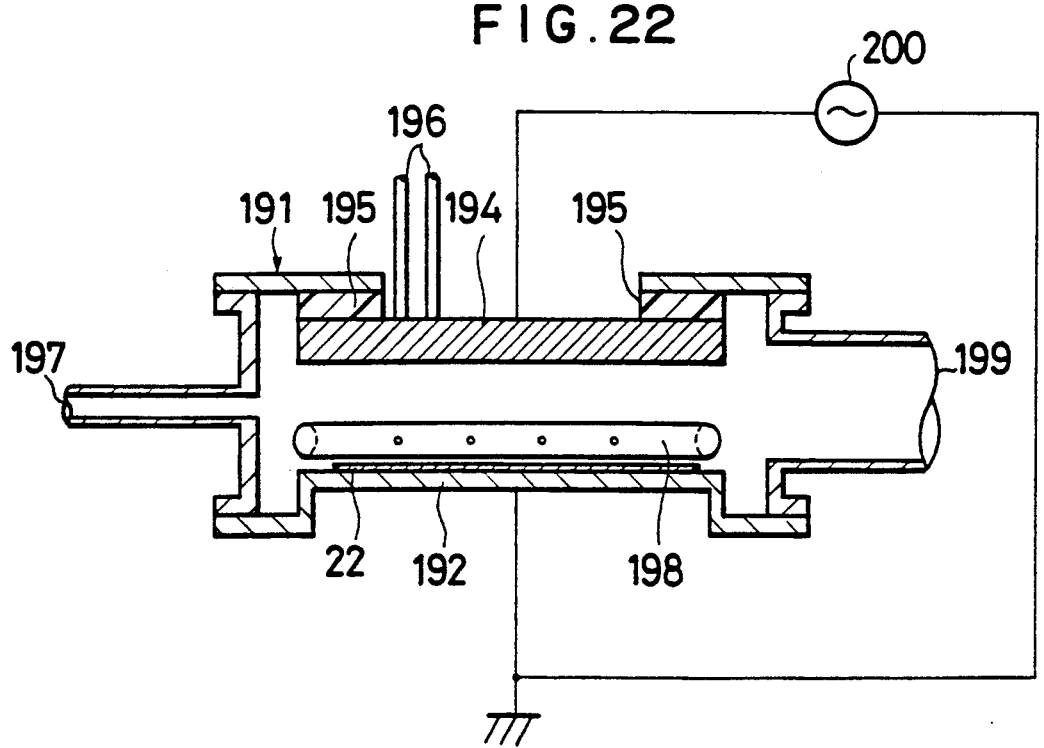
FIG. 22 is a schematic longitudinal cross sectional view of a seventh embodiment of the apparatus according to the present invention.

In FIG. 22, there is shown a seventh embodiment of the apparatus according to the present invention, i.e., an anode-coupled type parallel plate etching apparatus. In this embodiment, a reaction chamber 191 is provided with first and second inlet pipes 197 and 198 and an outlet pipe 199 to be connected to a vacuum pump (not shown). In the reaction chamber 191, the material 22 to be treated is mounted on a grounding anode electrode 192 constituting the bottom of the chamber 191, and a cathode electrode 194 is arranged as an upper wall in the upper portion of the chamber 191 via insulating members 195. A cooling tube 196 is mounted in the cathode electrode 194. A high frequency power source 200 is connected between the two electrodes 192 and 194.

The photoresist removing operation of the material 22 shown in FIG. 21b or FIG. 21c is conducted in the same manner as described above. Firstly, the mixture gas of the Freon-14 and the oxygen gas for generating fluorine radical was introduced into the chamber 191 through the inlet pipe 197 or 198 to keep the gas pressure to approximately 0.5 Torr, and the high frequency power source 200 was operated to apply 0.5 W/cm$^2$ of high frequency power between the two electrodes 192 and 194 to generate the plasma in the chamber 191. Then, the mixture gas was discharged from the chamber 191. The oxygen gas was introduced into the chamber 191 to keep the pressure to approximately one Torr, and by operating the power source 200, 1 W/cm$^2$ of high frequency power was applied between the two electrodes 192 and 194 to generate the plasma in the chamber 191. This step was continued for 10 minutes. Lastly, the chlorine gas was introduced into the chamber 191 to keep the pressure to approximately 0.4 Torr, and the 0.5 W/cm$^2$ of high frequency power was applied between the two electrodes 192 and 194 to generate the plasma in the chamber 191 in the same manner as the previous step. After processing the material 22, it was taken out and was observed using the SEM to find that the photoresist and the film walls could be completely and clearly removed, as shown in FIG. 21d, with the result of the same effects and advantages as those obtained in the sixth embodiment of the apparatus.

In FIGS. 23a 23a, there is shown an eighth embodiment of a barrel type apparatus according to the present invention. In a reaction quarts chamber 201, materials 22 such as wafers to be treated are placed on a table 203, and an etch tunnel 204 composed of a metal net having a tubular form is arranged between the materials 22 and the chamber 201 in order to prevent the materials 22 from exposure to charge particles or plasma and to minimize the amount of the charged particles attacking the materials 22. The chamber 201 is provided with an inlet pipe 205 attached to the top and an outlet pipe 206 connected to the bottom. A pair of electrodes 207 and 208 surround the chamber 201, and a high frequency power source 209 for generating the plasma in the chamber 201 is connected to the electrodes 207 and 208.

The photoresist removing treatment is carried out in the same manner as described above. First, the mixture gas of the Freon-14 and the oxygen gas was introduced into the chamber 201 through the inlet pipe 205 to keep its pressure to approximately one Torr, and then 500 W of high frequency power was applied between the chamber 201 and the table 203 by the power source 207 to generate the fluorine radical. The treatment by the fluorine radical was conducted for approximately 5 minutes, and then the gases were discharged from the chamber 201 through the outlet pipe 206. Then, the oxygen gas was introduced into the chamber through the inlet pipe 205 to keep the pressure to approximately one Torr, and 500 W of high frequency power was applied between the chamber 201 and the table 203 in the same way as the first step to generate the oxygen plasma. The photoresist and the carbon of the film walls were removed by the oxygen plasma. Then, the mixture gas of the carbon tetrachloride and the oxygen gas is introduced into the chamber 201 to keep the pressure to approximately one Torr, and the high frequency power were applied between the chamber 201 and the table 203 in the same manner as the first step to generate the plasma. The mixture gas plasma treatment was carried out for 10 minutes. After finishing the photoresist removing treatment, the materials 22 were observed by the SEM to find that the photoresist and the film walls could be completely and clearly removed, as shown in FIG. 21d.

In FIG. 24, there is shown a ninth embodiment of the apparatus according to the present invention, which is a dry plasma processing apparatus using the electron cyclotron resonance discharge. In this case, a reaction chamber 211, in which the material 22 to be processed is mounted on the table 23, is formed with two inlet pipes 214 and 215 on its upper and intermediate portions and an outlet pipe 216 on its lower portion. The chamber 211 includes a discharge tube 218 made of quarts in its upper half portion and magnets 219 arranged outside of the discharge tube 218. When a microwave of 2.45 GHz is applied from a generator (not shown) to the discharge tube 218 through a wave guide 217 and the magnets 219 generate 875 gauss of magnetic field in the discharge tube 218, electrons resonate with the microwave to conduct the cycloid movement, as a result generating the dense plasma in the discharge tube 218.

In general, in the apparatus of this kind, the etching is practiced at a low pressure of approximately 0.0001 Torr. However, when the apparatus is operated at a high pressure, a large amount of radicals can be generated and the etching can be effectively performed. The photoresist and the film walls of the material 22 can be completely and clearly removed in the same manner as the embodiments shown in FIGS. 20, 22 and 23.

Figure 25:
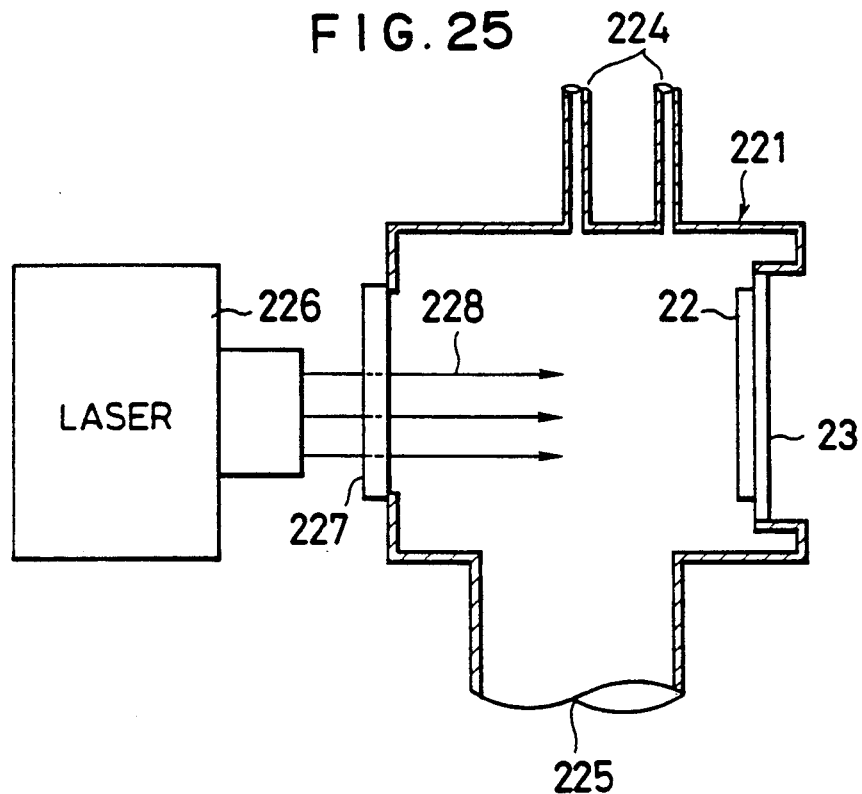
FIG. 25 is a schematic longitudinal cross sectional view of a tenth embodiment of the apparatus according to the present invention.

In FIGS. 25, there is shown a tenth embodiment of the apparatus according to the present invention, which is a dry etching apparatus utilizing radicals generated by using luminous energy. In this embodiment, a vacuum reaction chamber 221 is provided with the table 23 on one side wall for supporting the material 22 to be treated, inlet pipes 224 on the top wall, an outlet pipe 225 on the bottom, and a window 227 on the opposite side wall for introducing the light beam 228 generated by a laser generator 226.

The photoresist removing operation is carried out as follows. First, the nitrogen trifluoride is introduced into the chamber 221 through the inlet pipe 224 to keep the gas pressure to approximately 30 Torr, and an BrF excimer laser light beam 228 is irradiated from the laser generator 226 into the chamber 211 through the window 227. Then, the nitrogen trifluoride absorbs the excimer laser light beam and decomposes itself to generate the fluorine radical.

In this case, the decomposition speed of the nitrogen tetrafluoride by the laser light beam is slow and thus this step requires approximately 30 minutes. Then, the ozone gas is introduced into the chamber 221 through the inlet pipe 224 to keep the pressure to approximately 50 Torr, and the BrF excimer laser light beam 228 is emitted from the laser generator 226 into the chamber 221. The ozone absorbs the excimer laser light beam to generate the oxygen radical. Next, the chlorine gas is introduced into the chamber 221 through the inlet pipe 224 to keep the pressure to approximately 30 Torr, and the XeCl excimer laser light beam is emitted from the laser generator 226 into the chamber 211. Since this excimer laser light beam possesses a wave length of 303 nm, the chlorine gas well absorbs the excimer laser light beam to generate chlorine radicals. In this embodiment, it is confirmed that the photoresist and the film walls of the material 22 can be completely and clearly removed without producing any residue on the material in the same manner as the embodiments shown in FIGS. 20, 22, 23 and 24.

Figure 26:
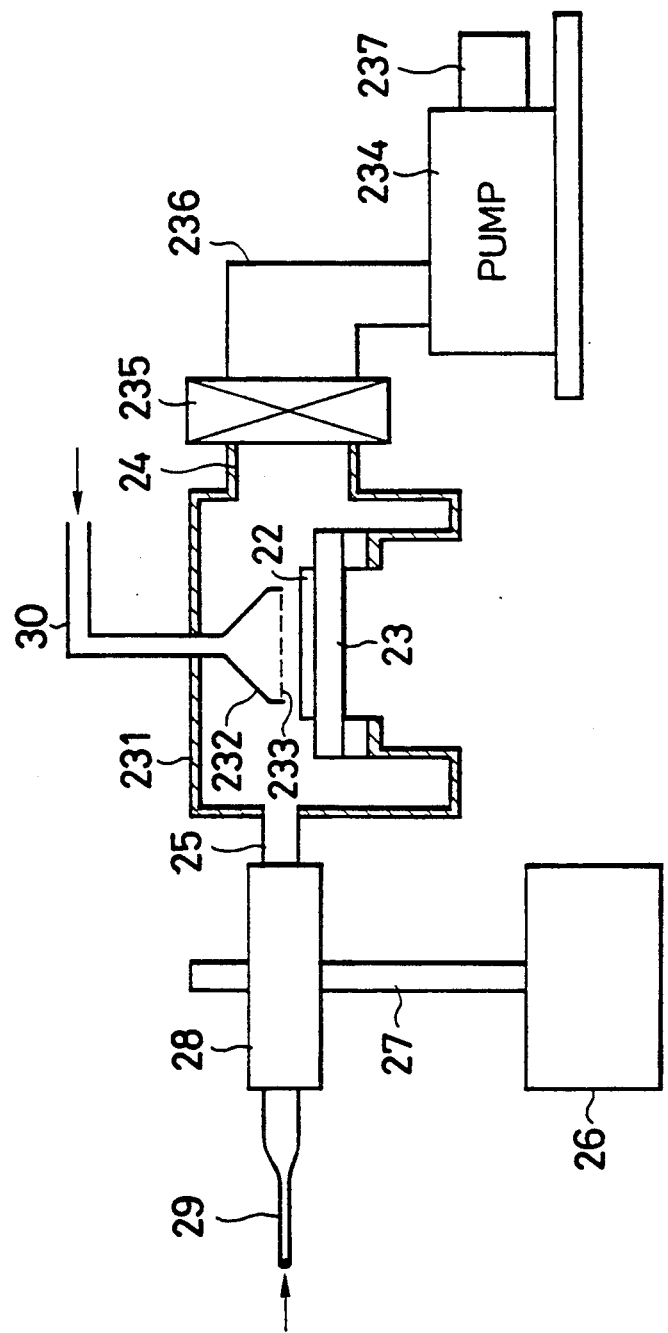
FIG. 26 is a schematic longitudinal cross sectional view of an eleventh embodiment of the apparatus according to the present invention.

There is shown in FIG. 26 an eleventh embodiment of the apparatus according to the present invention, having a similar construction to the ones of the embodiments shown in FIGS. 3, 6, 9 and 20. In this embodiment, the first inlet pipe 25 is coupled to one side wall of a reaction chamber 231 and a second inlet pipe 30 is connected to the central portion of the top wall of the chamber 231 and is linked to a nozzle 232 having a plurality of openings 233 open right above the material 22 mounted on the table 23. The outlet pipe 24 is mounted to another side wall opposite the first inlet pipe 25 and an oil rotary pump 234 having an exhaust pipe 237 for exhausting the gas from the chamber 231 is connected to the outlet pipe 24 via a valve 235 and a duct 236.

Figure 27:
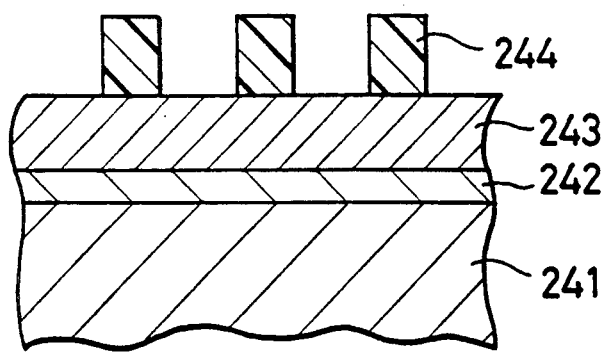
FIGS. 27(a)-27(d) are schematic longitudinal cross sectional views of an etching process conducted in the apparatus of FIG. 26.
Figure 27:
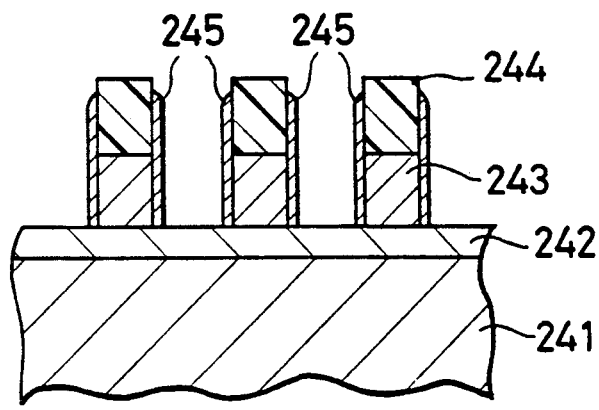
Figure 27:
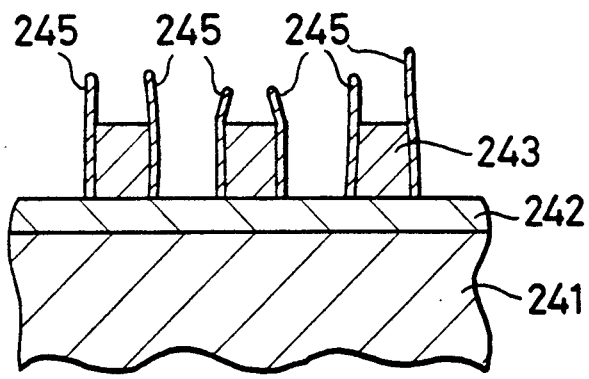
Figure 27:
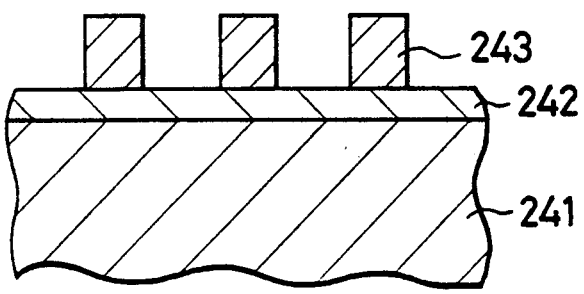

FIG. 27 schematically shows an etching process of the material 22 using the apparatus shown in FIG. 26. A silicon oxide film 242 having a thickness of approximately 100Å is formed on a silicon base plate 241, and then a polycrystalline silicon film 243 is formed on the silicon oxide film 242 in the conventional way. Then, a photoresist film pattern 244 is formed on the polycrystalline silicon film 243 in a conventional manner, to obtain the material 22 shown in FIG. 27a. Then, the polycrystalline silicon film 243 of the material 22 of FIG. 27a is etched using the photoresist film pattern 244 as the mask in the reactive ion etching process. During the etching process, film walls 245 are formed on the side walls of the photoresist film pattern 244 and the patterned polycrystalline silicon film 243, as shown in FIG. 27b. Then, the material of FIG. 27b is set on the table 23 in the chamber 231 shown in FIG. 26, and will be treated therein.

When the photoresist removing treatment was performed using a conventional oxygen plasma ashing apparatus, the film walls 245 were not removed, as shown in FIG. 27c.

The photoresist removing treatment of the material shown in FIG. 27b or FIG. 27c was conducted using the apparatus shown in FIG. 26 in the same way as described above, thereby completely and clearly removing the photoresist 244 and the film walls 245, as shown in FIG. 27d. Further, as shown FIG. 26, the gas including nitrogen trifluoride (NF$_3$) and the water vapor (H$_2$O) may be introduced into the chamber 231 through the first and second inlet pipes 25 and 30, respectively, and the photoresist removing may be conducted in the same way as the first embodiment described above to obtain the material shown in FIG. 27c, and then the material may be treated in the same manner as described above.

Figure 28:
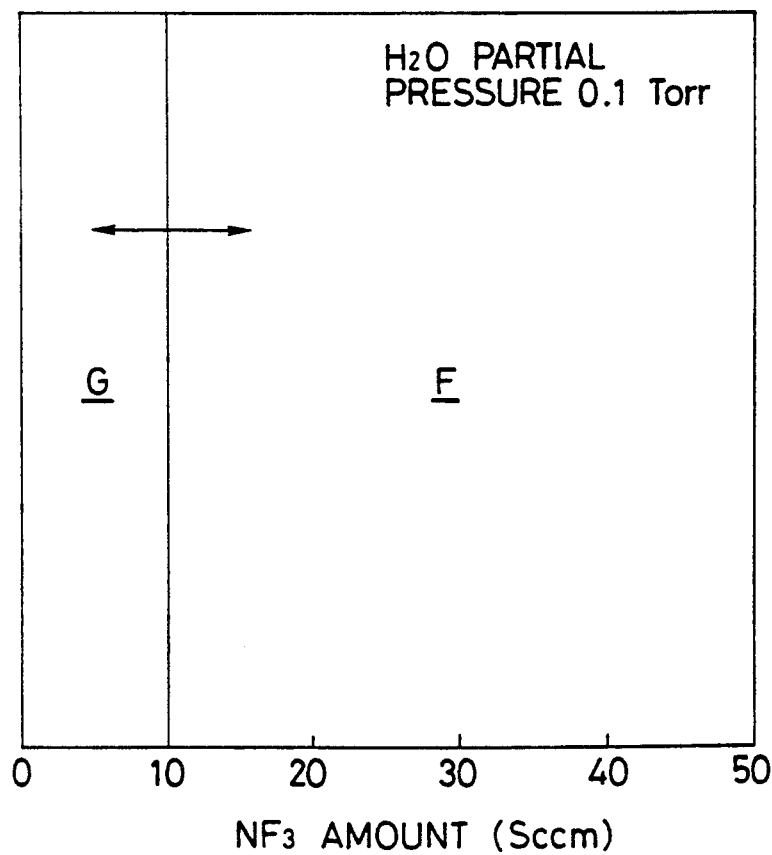
FIG. 28 is a graphical representation showing a relation between an $NF_3$ amount and removable an unremovable areas of the material in the etching process of FIG. 27.

FIG. 28 shows the relation between the flowing amount (sccm) of the nitrogen trifluoride (NF$_3$) with respect to the fixed partial pressure 0.1 Torr of the water vapor (H$_2$O) and the removable and unremovable areas F and G of the material 22 in the above described embodiment of FIG. 26. When the flowing amount of the nitrogen trifluoride is small, the film walls 245 of the material 22 cannot be removed, but, when the flowing amount of the nitrogen trifluoride is sufficient, the film walls 245 of the material 22 can be completely removed. In this case, it is considered that the nitrogen trichloride is activated by the microwave discharge to generate the fluorine radical, and the fluorine radical reacts with the water to generate the oxygen radical, and that the fluorine radical and the oxygen radical affect the material 22 in the same time, which is important for removing the film walls 245 of the material 22. In this embodiment, the gas for generating the fluorine radical by the electric discharge, such as sulfur hexafluoride (SF$_6$), carbon tetrafluoride (CF$_4$), boron trifluoride (BF$_3$), phosphorus trifluoride (PF$_3$), phosphorus pentafluoride (PF$_5$) or the like, may be also used in the same manner as nitrogen trifluoride (NF$_3$) with the same effects and advantages. Further, instead of the water vapor (H$_2$O) alcohols such as methyl alcohol (CH$_3$OH), ethyl alcohol (C$_2$H$_5$OH) and the like may be used with the same effects and advantages.

Figure 29:
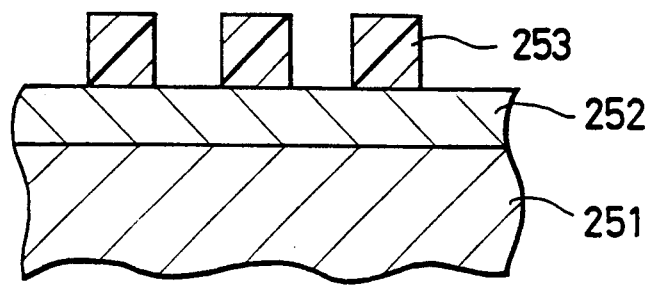
FIGS. 29(a)-29(b) are schematic longitudinal cross sectional views of another etching process performed in the apparatus of FIG. 26.
Figure 29:
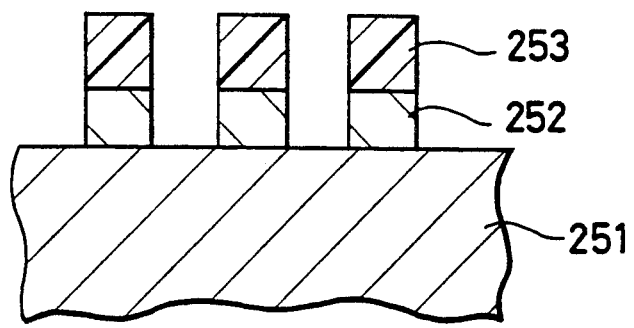

FIG. 29 schematically shows another etching process of the material 22 using apparatus shown in FIG. 26. A silicon oxide film 252 having a thickness of approximately one micrometer is formed on a silicon base plate 251 by heating the base plate 251 at approximately 1000° C., and then a photoresist film pattern 253 is formed on the silicon oxide film 252 in a conventional manner, as shown in FIG. 29a. Then, the silicon oxide film 252 is etched using the photoresist film pattern 253 as the mask by supplying carbon tetrafluoride (CF$_4$) and the hydrogen gas (H$_2$) in the reactive ion etching process. During the etching process, film walls are formed on the side walls of the photoresist film pattern and the patterned silicon oxide film 252 in the same way as described above in connection with FIG. 27.

Then, when the photoresist removal of the material 22 is conducted in a conventional oxygen plasma ashing process, the film walls could not be removed. The photoresist removing treatment of the material 22 is carried out in the chamber 231 in FIG. 26 using the nitrogen trifluoride (NF$_3$) and the water vapor (H$_2$O) in the same manner as described above according to the present method, the photoresist 253 and the film walls could be completely and clearly removed, as shown in FIG. 29b.

In this embodiment, when it is difficult to feed the water vapor (H$_2$O) into the chamber, the carrier gas such as hydrogen (H$_2$), nitrogen (N$_2$) or oxygen (O$_2$) may be used with the same effects and advantages. Further, this embodiment is not restricted to the treatment of the polycrystalline silicon film and the silicon oxide film, and may be applied to other materials such as silicon nitride film, molybdenum, tungsten, titanium, tantalum, hafnium and siliside thereof film and the like.

Although the present invention has been described in its preferred embodiments with reference to the accompanying drawings, it is readily understood that the present invention is not restricted to the preferred embodiments and that various changes and modifications may be made in the present invention by a person skilled in the art without departing from the spirit and scope of the present invention.

What is claimed is:

1. A method of generating a first pattern on a surface comprising the steps of:
   a) forming a second pattern of a resist on said surface;
   b) etching said surface through said second pattern in order to generate said first pattern; and
   c) removing said second pattern by a reactive gas mainly comprised of fluorine radicals and a second gas selected from the group consisting of hydrogen or a compound comprising two or more hydrogen atoms or at least one OH group.

2. A method of claim 1 wherein said surface is made of a metallic material.

3. A method of claim 2 wherein said metallic material comprises aluminum or an aluminum alloy.

4. A method of claim 3 wherein said aluminum or aluminum alloy is in the form of a film, which is formed on a surface of a substrate.

5. A method of claim 4 wherein said surface of said substrate comprises silicon or a silicon compound.

6. A method of claim 5 wherein said surface of said substrate comprise silicon oxide.

7. A method of claim 6 wherein said silicon oxide is a film which coats a silicon semiconductor.

8. A method of claim 1 wherein said second gas comprises a hydrocarbon having two or more hydrogen atoms.

9. A method of claim 1 wherein said second gas comprises water or an alcohol.

10. A method of claim 1 wherein said step c) comprises mixing said fluorine radicals with said second gas in a chamber in which said surface is located.

11. A method of claim 10 wherein said second gas is introduced into said chamber together with a carrier gas.

12. A method of claim 11 wherein said carrier gas is selected from the group consisting of hydrogen, oxygen, and argon, wherein hydrogen is not both the sole carrier gas and the sole second gas.

13. A method of claim 11 wherein said carried gas is bubbled in a solution including water or an alcohol and introduced into said chamber in order to transport said water or said alcohol in a fluid form as said second gas.

14. A method of claim 10 wherein said fluorine radicals are generated in a place apart from said chamber and then introduced into said chamber.

15. A method of claim 1 wherein said fluorine radicals are generated by activating a gas selected from the group consisting of $SF_6$, $NF_3$, $CF_4$, $C_2F_6$, $C_3F_8$, $SF_6+O_2$, $NF_3+O_2$, $CF_4+O_2$, $C_2F_6+O_2$, $C_3F_8+O_2$, $BF_3$, $PF_3$, $PF_5$, $XeF_2$, $F_2$, $F_3Cl$, $FCl_3$, $ClF_5$, and $SiF_4$.

16. A method of claim 15 wherein the generation of said fluorine radicals is carried out by applying energy to said gas.

17. A method of claim 16 wherein said energy is applied in a form selected from the group consisting of heat, electron beam, light beam, laser light beam, electric discharge, and microwaves.

18. A method of claim 16 wherein said fluorine radicals are generated in a chamber.

19. A method of claim 17 wherein said energy is applied in a form selected from the group consisting of heat, electron beam, light beam, laser light beam, electric discharge, and microwave.

20. A method of claim 1 further comprising a step of:
   d) removing residues attached to said first pattern with activated chlorine after said step c).

21. A method of claim 20 wherein said activated chlorine is generated by activating chlorine or a compound containing chlorine.

22. A method of claim 21 wherein said chlorine or compound containing chlorine is selected from the group consisting of $Cl_2$, $CCl_4$, $BCl_3$, $SiCl_4$, $PCl_3$, and $PCl_5$.

23. A method of claim 1 wherein said surface is cooled by a cooler, during said step c).

24. A method of patterning an aluminum or an aluminum alloy film formed on a substrate comprising:
   forming a resist pattern over said aluminum or an aluminum film;
   reactive ion etching said aluminum or an aluminum film through said resist pattern; and
   removing said resist pattern by a reactive gas mainly comprised of fluorine radicals and a compound comprising two or more hydrogen atoms or at least one OH group activated by said fluorine radicals.

25. A method of patterning a metallic film comprising the steps of:
   a) forming a resist pattern on said metallic film;
   b) producing a metallic pattern by etching through said resist pattern;
   c) removing said resist pattern by etching with fluorine radicals and oxygen radicals; and
   d) removing residues attached to said metallic pattern with activated chlorine after said step c).

26. A method of claim 25 wherein said activated chlorine is generated by activating chlorine or a chlorine compound selected from the group consisting of $Cl_2$, $CCl_4$, $BCl_3$, $SiCl_4$, $PCl_3$, and $FCl_5$.

27. A method of claim 25 wherein said step c) is carried out by causing reaction of said fluorine radicals with said resist pattern and thereafter causing reaction of said oxygen radicals with said resist pattern.

28. A method of claim 25 wherein said fluorine radicals are generated by activating a gas selected from the group consisting of $SF_6$, $NF_3$, $CF_4$, $C_2F_6$, $C_3F_8$, $SF_6+O_2$, $NF_3+2$, $CF_4+O_2$, $CF_2F_6+O_2$, $C_3F_8+O_2$, $BF_3$, $PF_3$, $PF_5$, $XeF_2$, $F_2$, $F_3Cl$, $FCl_3$, $ClF_5$, and $SiF_4$.

29. A method of claim 25 wherein said oxygen radicals are generated by activating oxygen or an oxygen compound selected from the group consisting of $O_2$, $CO$, $CO_2$, $N_2O$, $NO$, $N_2O_3$, $SO_2$, and $H_2O$.

30. A method of claim 25 wherein said metallic pattern comprises aluminum or an aluminum alloy.

31. A method of claim 1, wherein said second gas is selected from the group consisting of water vapor, hydrogen, alcohols, and hydrocarbons.

32. A method of claim 31, wherein said second gas comprises a hydrocarbon.

33. A method of claim 32, wherein said hydrocarbon is selected from the group consisting of $CH_4$ and $C_2H_6$.

34. A method of claim 1, wherein said second gas comprises a compound containing at least one OH group which is other than water.

35. A method of claim 34, wherein said second gas comprises an alcohol.

36. A method of claim 35, wherein said alcohol is selected from the group consisting of $CH_3OH$ and $C_2H_5OH$.

* * * * *